(12) United States Patent
Saito et al.

(10) Patent No.: US 6,443,326 B1
(45) Date of Patent: Sep. 3, 2002

(54) ELECTRONIC COMPONENT FEEDING APPARATUS

(75) Inventors: Koji Saito; Taro Yasuda, both of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/927,521

(22) Filed: Aug. 13, 2001

Related U.S. Application Data

(63) Continuation of application No. 09/207,116, filed on Dec. 8, 1998.

(30) Foreign Application Priority Data

Dec. 9, 1997 (JP) .............................................. 9-338682

(51) Int. Cl.$^7$ ................................................ B23Q 7/12
(52) U.S. Cl. ...................................... 221/163; 221/278
(58) Field of Search ................................ 221/278, 256, 221/157, 223, 200, 172, 168, 263, 268, 211, 163; 406/137

(56) References Cited

U.S. PATENT DOCUMENTS

| | | | |
|---|---|---|---|
| 5,392,954 A | | 2/1995 | Gartz |
| 5,853,108 A | * | 12/1998 | Ando et al. ................. 221/163 |
| 6,041,964 A | * | 3/2000 | Tokarz et al. ............... 221/211 |

FOREIGN PATENT DOCUMENTS

| | | |
|---|---|---|
| EP | 0 601 603 A1 | 6/1994 |
| JP | 6-232596 | 8/1994 |
| SU | 1463433 | 3/1989 |

* cited by examiner

Primary Examiner—Kenneth W. Noland
(74) Attorney, Agent, or Firm—Lowe Hauptman Gilman & Berner, LLP

(57) ABSTRACT

A component transfer mechanism transfers chip components along a liner passage by applying an inhaling pressure or a discharging pressure of an air bag or an air cylinder directly to the chip components in the liner passage, or by operating a component transfer member through an air actuator by the inhaling pressure or the discharging pressure. A component take-in mechanism stirs chip components in a storage chamber and takes them into a feeding passage by applying the inhaling pressure or the discharging pressure of the air bag or the air cylinder directly to the chip components in the storage chamber, or by operating a component stirring member through the air actuator by the inhaling pressure or the discharging pressure. A component separating mechanism separates the foremost chip component from the succeeding chip components by applying the inhaling pressure or the discharging pressure of the air bag or the air cylinder directly to the foremost chip component in the liner passage, or by operating a component separating member through the air actuator by the inhaling pressure or the discharging pressure.

31 Claims, 13 Drawing Sheets

ELECTRONIC COMPONENT FEEDING APPARATUS

This application is a continuation of application Ser. No. 09/207,116 filed Dec. 8, 1998.

BACKGROUND OF THE INVENTION

1. Field of the Invention

The present invention relates to a component transfer mechanism of an electronic component feeding apparatus for transferring electronic components along a transfer passage, to a component take-in mechanism of the electronic component feeding apparatus for stirring electronic components stored in a storage chamber in a bulk state and for taking the electronic components into a feeding passage one by one, and to a component separating mechanism of the electronic component feeding apparatus for separating the foremost electronic component from succeeding electronic components out of electronic components which are transferred in alignment along the transfer passage.

2. Description of the Related Art

Japanese Patent Application Laid-open No. Hei 6-232596 discloses an electronic component feeding apparatus including a component transfer mechanism, a component take-in mechanism and a component separating mechanism.

The component transfer mechanism described in the above mentioned publication comprises an endless belt for transferring components, a ratchet mechanism for intermittently moving the belt, and a lever mechanism for driving the ratchet mechanism. According to this component transfer mechanism, an operation part of the lever mechanism is pushed, thereby operating the ratchet mechanism through the lever mechanism, the belt is intermittently moved by the operation of the ratchet mechanism, and chip components are transferred along a passage.

The component take-in mechanism described in the publication comprises a storage chamber for storing the chip components in a bulk form, a transfer tube for taking in the chip components and guiding them downward, a take-in tube vertically movably disposed outside of an upper portion of the transfer tube, and a lever mechanism for vertically moving the take-in tube. According to the component take-in mechanism, an operation part of the lever mechanism is pushed, thereby vertically moving the take-in tube through the lever mechanism, the components in the storage chamber are stirred by vertical movement of the take-in tube, and the chip components in the storage chamber are taken in an upper opening of the transfer tube one by one.

Further, the component separating mechanism described in the publication comprises an endless belt for transferring the components, a movable stopper disposed on a predetermined position on the belt, and a lever mechanism for moving the stopper forward and backward. According to the component separating mechanism, an operation part of the lever mechanism is pushed, thereby forwardly moving, through the lever mechanism, the stopper which is located at component-stop position, and the stopper is separated from the foremost chip component. This component separating mechanism is for separating the stopper from the foremost chip component, and is not for separating the foremost chip component from the succeeding chip components.

In the above-described apparatus each of the component transfer mechanism, the component take-in mechanism and the component separating mechanism is driven by the corresponding one of the lever mechanisms. Therefore, a structure of each of the lever mechanisms is prone to be complicated, and the apparatus itself is increased in size by the influence of the complicated lever mechanisms. Further, the existences and the positions of the lever mechanisms restrain and hinder the design, so that flexibility in design is lowered.

SUMMARY OF THE INVENTION

It is an object of the present invention to provide a component transfer mechanism, a component take-in mechanism and a component separating mechanism of an electronic component feeding apparatus, which can be structured to be compact and can secure high flexibility in design.

To achieve the above object, a component transfer mechanism of the present invention comprises a fluid unit capable of discharging and inhaling a fluid by applying an external force, and electronic components in a transfer passage are transferred by utilizing a discharging pressure or an inhaling pressure of the fluid unit. According to the component transfer mechanism, since the components in the transfer passage can be transferred only by applying the external force to the fluid unit, the complicated lever mechanism as in the conventional apparatus is not required, and the mechanism itself can be made compactly. Further, since fluid piping can be freely designed, the existence and the position of the fluid unit -do not restrain and hinder the design, and high flexibility in design can be secured.

A component take-in mechanism of the present invention comprises a fluid unit capable of discharging and inhaling a fluid by applying an external force, and the electronic components in a storage chamber are stirred by utilizing a discharging pressure or an inhaling pressure of the fluid unit. According to this component take-in mechanism, since the electronic components in the storage chamber are stirred only by applying the external force to the fluid unit to take the electronic components into a feeding passage one by one, the lever mechanism as in the conventional apparatus is not required, and the mechanism itself can be made compactly. Further, since fluid piping can be freely designed, the existence and the position of the fluid unit do not restrain and hinder the design, and high flexibility in design can be secured.

Further, a component separating mechanism of the present invention comprises a fluid unit capable of discharging and inhaling a fluid by applying an external force, and a separation of the foremost electronic component is conducted by utilizing a discharging pressure or an inhaling pressure of the fluid unit. According to the component separating mechanism, since the foremost chip component can be separated from the succeeding chip components only by applying the external force to the fluid unit, the complicated lever mechanism as in the conventional apparatus is not required, and the mechanism itself can be made compactly. Further, since fluid piping can be freely designed, the existence and the position of the fluid unit do not restrain and hinder the design, and high flexibility in design can be secured.

The above object and other objects, features and advantages of the present invention will become apparent from the following description and the accompanying drawings.

DESCRIPTION OF THE PREFERRED EMBODIMENTS

Figure 1:
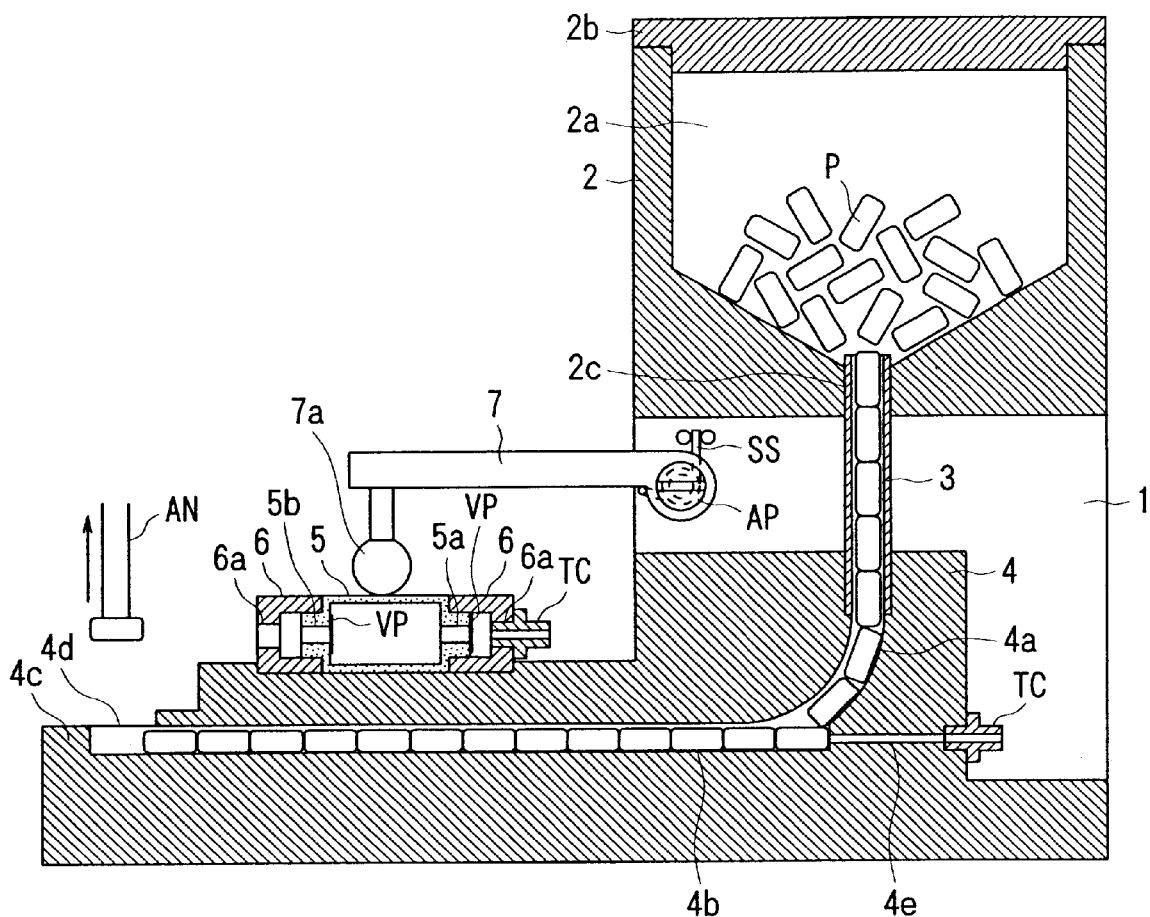
FIG. 1 is a view showing a first embodiment in which a discharging pressure of an air bag is applied directly to chip components to transfer the components.

FIG. 1 is a view showing a first embodiment in which a discharging pressure of an air bag is applied directly to chip components to transfer the components. In FIG. 1, the reference number 1 represents a frame, 2 represents a hopper, 3 represents a chute tube, 4 represents a component guide, 5 represents an air bag, 6 represents bag holding members, 7 represents an operation lever and AN represents a suction nozzle for taking the components out. For the purpose of convenience, the following description will be made assuming that left and right sides in FIG. 1 are front and rear sides, respectively.

The hopper 2 comprises a storage chamber 2a, a lid 2b capable of covering and opening an upper end opening of the storage chamber 2a, and a through hole 2c formed in a bottom of the storage chamber 2a. The hopper 2 is detachably mounted on the frame 1. A large number of one kind of prism or cylindrical chip components P such as a chip capacitor, a chip resistor and chip inductor are stored in the storage chamber 2a in a bulk state. Of course, electronic components other than the chip component, for example, a composite component such as a LC filter and a network, and an integrated circuit component such as a semiconductor device can be handled as subject to be supplied if they have shapes as described above.

The chute tube 3 is made of metal pipe or hard resin pipe having a predetermined length. A lower end of the chute tube 3 is fixed to the component guide 4, and an upper end of the chute tube 3 is vertically inserted and fixed to the through hole 2c such that the upper end of the chute tube 3 substantially coincides with an upper end of the through hole 2c. A wall thickness of the chute tube 3 is smaller than the maximum length of an end surface of the chip component P to be supplied. In order to prevent each chip component from being caught, an inner edge of the upper end of the chute tube 3 is rounded or chamfered off if necessary. Further, the shape of cross section of an inner hole of the chute tube 3 is rectangular or circular slightly larger than the shape of the end surface of the chip component P to be supplied.

The component guide 4 comprises a curved passage 4a continued to the inner hole of the chute tube 3, and a horizontal liner passage 4b continued to the curved passage 4a. The component guide 4 is detachably mounted on the frame 1. The shape of cross section of each of the curved passage 4a and the liner groove 4b is rectangular, and is slightly larger than the shape of the end surface of each chip component P to be supplied. The curved passage 4a is curved at a constant curvature from a vertical direction to a horizontal direction through about 90° as viewed from a side. Further, the liner passage 4b is provided at its front end portion with a stopper 4c for stopping the chip components P which are arranged and transferred along the liner passage 4*b*, and a component picking out port 4*d* for exposing foremost chip component P which comes in contact with the stopper 4*c*. Furthermore, the component guide 4 is provided at its rear portion with a vent hole 4*e* extending from a rear wall of the component guide 4 to a rear end of the liner passage 4*b*. A tube connection tool TC is mounted to a rear end of the vent hole 4*e*.

Figure 2:
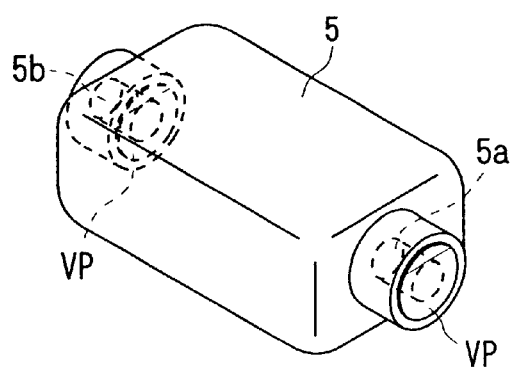
FIG. 2 is a perspective view of the air bag used in the first embodiment.

The air bag 5 is made of synthetic rubber such as SBR and silicon as shown in FIG. 2, and is hollow and has moderate elasticity. The air bag 5 is provided at its rear end with a discharge port 5*a*. The discharge port 5*a* is provided at its outside with a normally-closed valve plate VP for openably closing the discharge port 5*a*. The air bag 5 is formed at its front end with an intake port 5*b*. The intake port 5*b* is provided at its inside with a normally-closed valve plate VP for openably closing the intake port 5*b*. Each of the valve plate VP is made of resin thin plate having flexibility. A portion of each of the valve plates VP is fixed to the air bag 5, and swingable other portions of the valve plates close and open the discharge port 5*a* and intake port 5*b*. The air bag 5 discharges and draws air by a compression deformation and elastic returning ability of its own, but a spring member may be provided in the air bag for assisting the air intake by the elastic returning ability. In the first embodiment, the air bag 5 is used as a fluid unit for discharging and inhaling fluid by applying an external force.

The bag holding members 6 are formed into bottomed cylindrical shape made of metal or hard resin, and they are air-tightly fitted to outsides of the discharge port 5*a* and the intake port 5*b*, respectively. The air bag 5 is mounted on an upper surface of the component guide 4 in a state where two bag holding members 6 are fitted to front and rear portions of the air bag 5. Each of the bag holding members 6 is provided with a vent hole 6*a*, and in the illustrated example, a tube connection tool TC is mounted to the vent hole 6*a* at the side of the discharge port 5*a*. This tube connection tool TC and another tube connection tool TC mounted to the vent hole 4*e* of the component guide 4 are connected to each other with use of a flexible air tube (not shown).

One end of the operation lever 7 is rotatably mounted on the frame. 1 through an axial pin AP. A coil spring SS is mounted to the axial pin AP, the operation lever 7 is urged in a clockwise direction by a biasing force of the coil spring SS to keep its normal position horizontally. Further, the operation lever 7 is provided at its front end (operation part) with a spherical pushing portion 7*a* for pushing and deforming the air bag 5. The operation part of the operation lever 7 is pushed by a portion associatively connected to the suction nozzle AN or another driving equipment using a motor or the like as a driving force source.

Next, the operation of the apparatus of the first embodiment will be explained with reference to FIGS. 3 and 4.

As shown in FIG. 1, the chip components P in the storage chamber 2*a* are taken into the upper end opening of the chute tube 3 one by one in its longitudinal direction by receiving vibration from a vibration generator (not shown), and are moved in the chute tube 3 by their own weight while keeping the longitudinal direction and enter in the lower curved passage 4*a*. The chip components P entering the curved passage 4*a* advance in the curved passage 4*a* by their own weight, and during this process, the chip components P change their flowing direction at an angle of about 90° from the vertical direction to the horizontal direction. After the flowing direction is changed, the chip components P enter the liner passage 4*b*.

Figure 3:
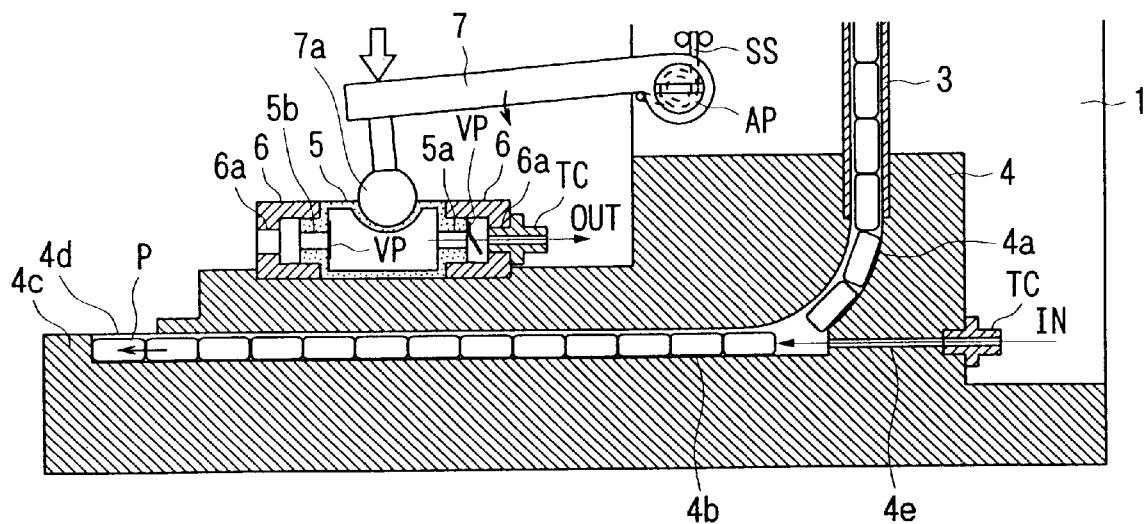
FIG. 3 is a view for explaining the operation of the first embodiment.

In this state, if the operation part of the operation lever 7 is pushed in a direction of the outline arrow as shown in FIG. 3, the operation lever 7 is pivoted in a counterclockwise direction against the biasing force of the coil spring SS, and the air bag 5 is crushed by the pushing portion 7*a* of the operation lever 7.

With this operation, the valve plate VP is opened by the discharge pressure from the discharge port 5*a* of the air bag 5, and the discharged air is sent to the vent hole 4*e* of the component guide 4 through an air tube (not shown). The air sent to the vent hole 4*e* is discharged forward from the rear end of the liner passage 4*b*, and the chip components P in the liner passage 4*b* are pushed and transferred forward by the discharge pressure (positive pressure). The chip components P transferred forward in their arranged state are stopped when the foremost chip component comes in contact with the stopper 4*c*.

Figure 4:
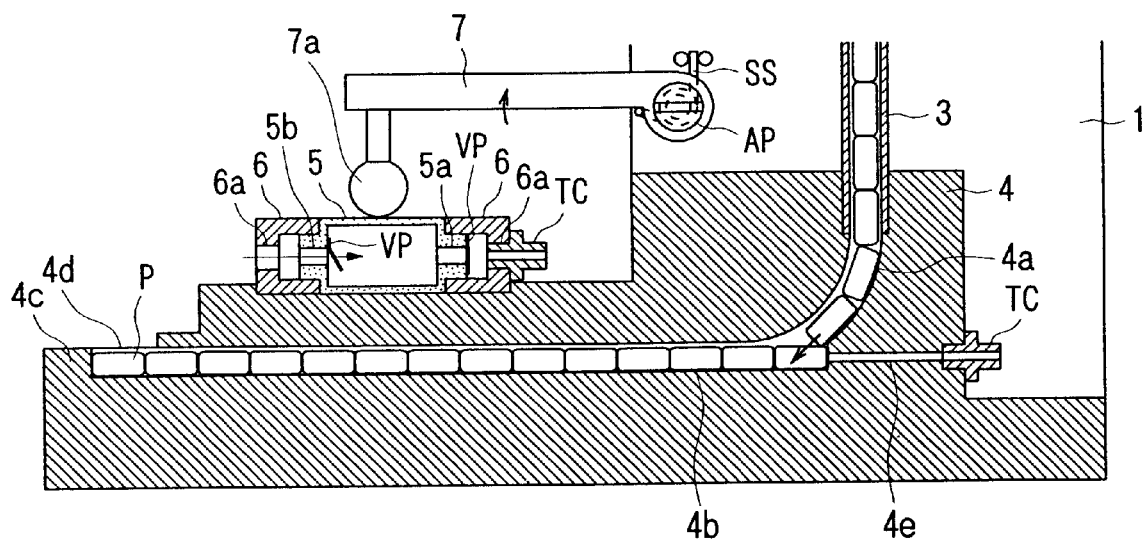
FIG. 4 is a view for explaining the operation of the first embodiment.

Thereafter, as shown in FIG. 4, if the pushing force against the operation part of the operation lever 7 is released, the operation lever 7 is returned to its original position by the urging force of the coil spring SS, and the air bag 5 is simultaneously restored in its original shape by an elasticity property of its own. During the process of the restoration of the air bag 5 to its original shape, the valve plate VP is opened by the inhaling pressure of the intake port 5*b*, and air enters in the air bag 5 from outside. At that time, since the valve plate VP at the side of the discharge port 5*a* is, of course, closed, intake pressure (negative pressure) should not act on the opening of the vent hole 4*e* at the side of the liner passage 4*b*.

As described above, according to the component transfer mechanism of the first embodiment, the discharge pressure (positive pressure) when the air bag 5 is crushed is directly applied to the chip components P in the linear passage 4*b*, thereby transferring the components in the linear passage 4*b*. That is, since the components in the linear passage 4*b* can be transferred only by applying the pushing force to the air bag 5, a complicated lever mechanism as in the conventional apparatus is unnecessary, and the component transfer mechanism can be made compactly. Further, piping for air can be freely designed, the existence and the position of the air bag 5 should not restrain and hinder the design, and high flexibility in design can be secured.

A valve structure such as a check valve comprising a spring-biased valve and a valve seat may be used instead of the valve plate VP mounted to the air bag 5. If the air bag 5 is directly pushed by a portion associatively connected to the suction nozzle AN or another driving equipment, the operation lever 7 in the first embodiment is unnecessary.

Figure 5:
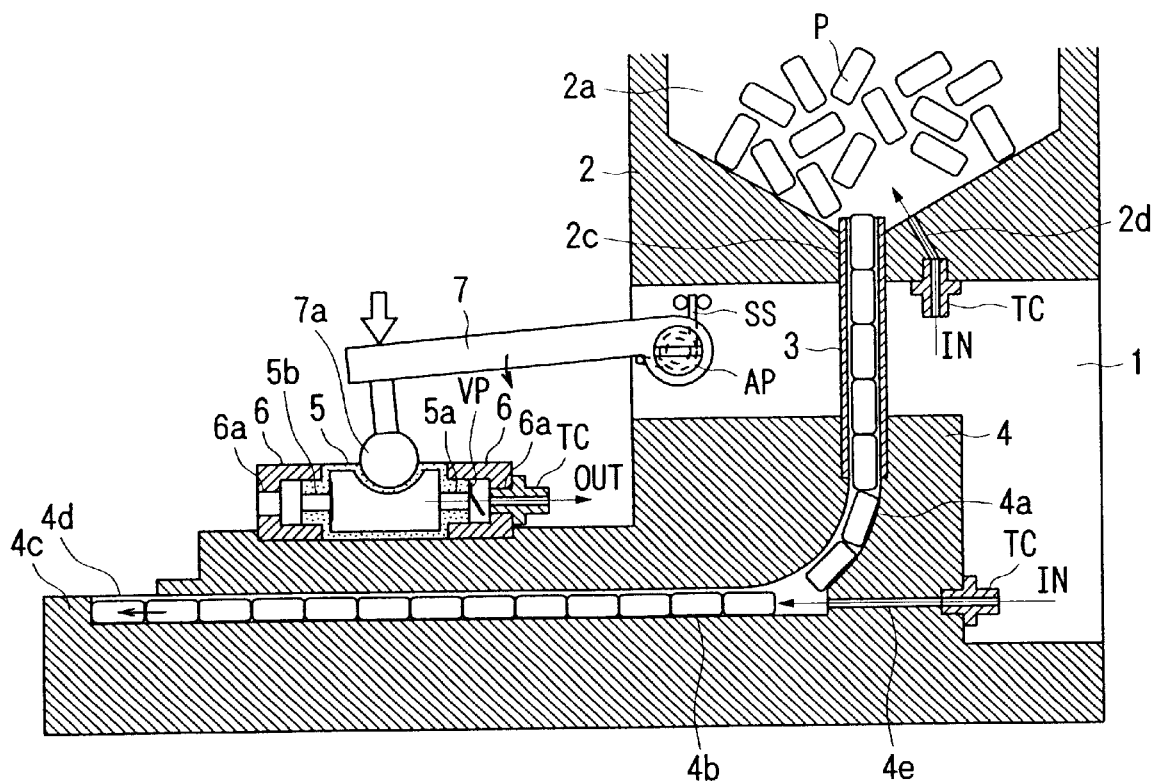
FIG. 5 is a view showing an example of structure of a component take-in mechanism applicable to the first embodiment.

Further, as shown in FIG. 5, if a vent hole 2*d* is formed from a lower surface of the hopper 2 to a bottom of the storage chamber 2*a*, preferably, in the vicinity of the upper end of the chute tube 3, and if the tube connection tool TC is mounted to the lower end of the vent hole 2*d*, and this tube connection tool TC and another tube connection tool TC mounted to the vent hole 6*a* at the side of the discharge port 5*a* of the air bag 5 are connected to each other through an air tube (not shown), the discharge pressure (positive pressure) generated when the air bag 5 is crushed by the operation lever 7 acts directly on the chip components P in the storage chamber 2*a* to stir the chip components P in the storage chamber 2*a*, and the component can be smoothly taken into the upper end opening of the chute tube 3. According to this component take-in mechanism, since the components in the storage chamber 2*a* are stirred and the chip components P can be taken into the upper end opening of the chute tube 3 one by one only by applying the pushing force acting on the air bag 5, a complicated lever mechanism as in the conventional apparatus is unnecessary, and the component take-in mechanism can be made compactly. Further, air piping can be freely designed, the existence and the position of the air bag 5 should not restrain and hinder the design, and high flexibility in design can be secured. If the vent hole is formed in the upper portion of the storage chamber 2a so that the inhaling pressure (negative pressure) generated when the air bag 5 returns to its original shape is directly applied to the chip components P in the storage chamber 2a, it is of course possible to stir the components in the same manner as that described above.

Figure 6:
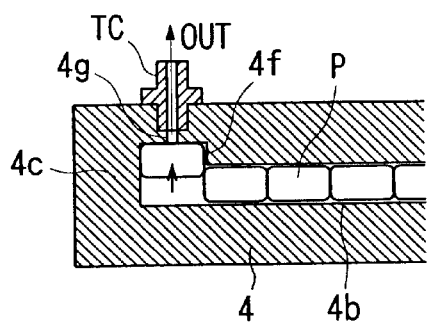
FIG. 6(A) is a view showing an example of structure of a component separating mechanism applicable to the first embodiment.
FIG. 6(B) is a view showing an example of structure of a succeeding component holding mechanism applicable to the first embodiment.
Figure 6:
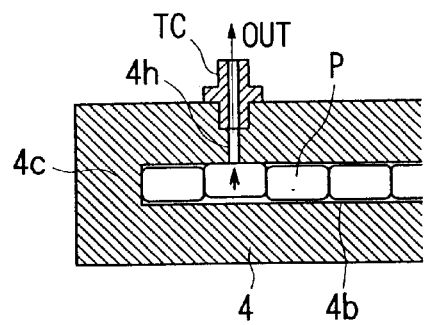

Further, as shown in FIG. 6(A), the liner passage 4b is provided at its side portion corresponding to the foremost chip component P with a recess 4f for taking in the foremost chip component P, a vent hole 4g is formed in the recess 4f and a tube connection tool TC is connected to the vent hole 4g, another tube connection tool TC (not shown) is connected to a vent hole 6a at the side of the intake port 5b of the air bag 5, and both the tube connection tools TC are connected through an air tube (not shown). According to this structure, the inhaling pressure (negative pressure) generated when the air bag 5 returns to its original shape is directly applied to the opening of the vent hole 4g at the side of the recess 4f, thereby pulling the foremost chip component P which is stopped by the stopper 4c into the recess 4f, and the foremost chip component P can be separated from the succeeding chip components P. According to the component separating mechanism, since the foremost chip component P can be separated from the succeeding chip components P only by releasing the pushing force acting on the air bag 5, a complicated lever mechanism as in the conventional apparatus is unnecessary, and the component separating mechanism can be made compactly. Further, air piping can be freely designed, the existence and the position of the air bag 5 should not restrain and hinder the design, and high flexibility in design can be secured.

Furthermore, as shown in FIG. 6(B), the liner passage 4a is provided at its side portion corresponding to a second chip component P with a vent hole 4h and a tube connection tool TC is connected to the vent hole 4h, another tube connection tool TC (not shown) is connected to a vent hole 6a at the side of the intake port 5b of the air bag 5, and both the tube connection tools TC are connected through an air tube (not shown). According to this structure, if the inhaling pressure (negative pressure) generated when the air bag 5 is restored in its original shape is directly applied to the opening of the vent hole 4h at the side of the liner passage 4a, the second chip component P can be absorbed and held by the side surface of the liner passage 4a. According to this succeeding component holding mechanism, since the second chip component P can be held at a stop position only by releasing the pushing force acting on the air bag 5, when the foremost component P is taken out by the suction nozzle AN, the second chip component P should not be taken out together or inclined. If this succeeding component holding mechanism is used in combination with the component separating mechanism shown in FIG. 6(A), it is possible to take out the foremost chip component P more stably.

Figure 7:
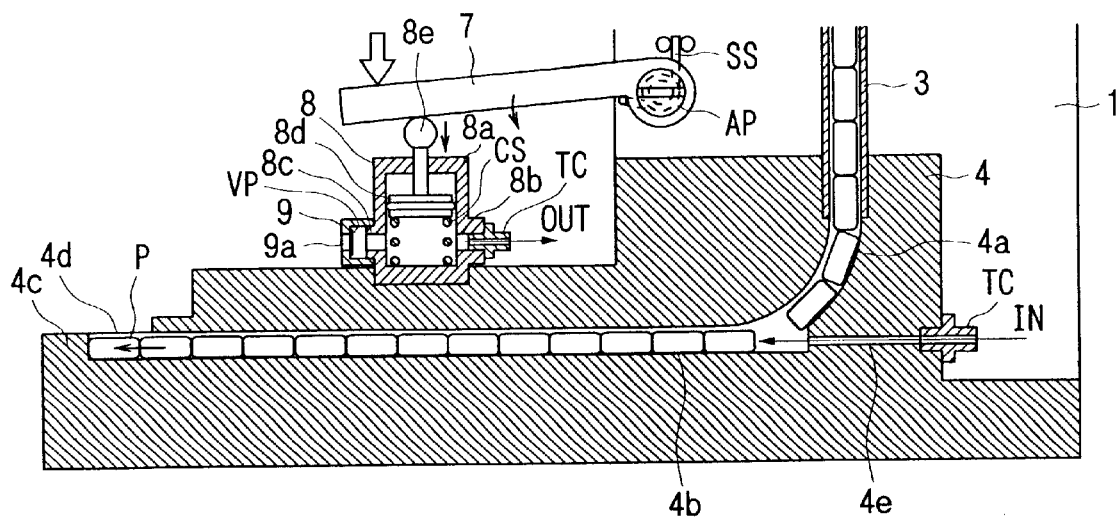
FIG. 7 is a view showing an example of structure using an air cylinder instead of the air bag in the first embodiment.

Although the air bag 5 is used as the fluid unit in the first embodiment, the air bag 5 and the bag holding members 6 may be deleted, and an air cylinder 8 shown in FIG. 7 may be used as the fluid unit. The air cylinder 8 has a cylinder 8a having a discharge port 8b and an intake port 8c. A cap 9 having a vent hole 9a is air-tightly fitted to the intake port 8c. A tube connection tool TC is mounted to the discharge port 8b. The vent hole 9a of the cap 9 is provided at its inner side with a normally-closed valve plate VP for openably closing the vent hole 9a. The tube connection tool TC and another tube connection tool TC provided at the vent hole 4e of the component guide 4 are connected to each other through an air tube (not shown). A piston 8d is movably inserted in the cylinder 8a air-tightly. A rod 8e having a spherical head is connected to the piston 8d and is projected outward from the cylinder 8a. A coil spring CS for upwardly biasing the piston 8d is disposed in the cylinder 8a.

As shown in FIG. 7, if the operation part of the operation lever 7 is pushed in the direction of outline arrow, the operation lever 7 is rotated in the counterclockwise direction against the biasing force of the coil spring SS, and the rod 8e and the piston 8d of the air cylinder 8 are moved downward against the biasing force of the coil spring CS.

With this operation, air discharged from the discharge port 8b of the air cylinder 8 is sent to the vent hole 4e of the component guide 4 through the air tube (not shown). The air sent to the vent hole 4e is discharged forwardly from the rear end of the liner passage 4b. At that time, the chip components P in the liner passage 4b are pushed and transferred forward by this discharge pressure (positive pressure). The chip components P arranged and transferred forward are stopped when the foremost chip component comes in contact with the stopper 4c.

Figure 8:
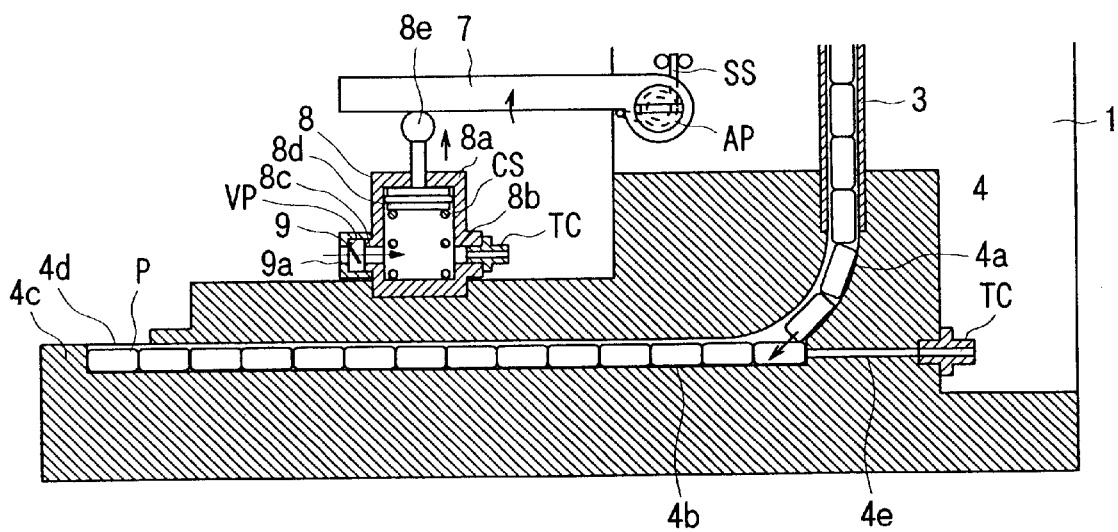
FIG. 8 is a view for explaining the operation of the apparatus shown in FIG. 7.

After that, if the pushing force against the operation part of the operation lever 7 is released, the operation lever 7 returns to its original position by the urging force of the coil spring SS as shown in FIG. 8, and the rod 8e and the piston 8d of the air cylinder 8 return to their original positions by the biasing force of the coil spring CS. During the process of the piston 8d returning to its original position, the valve plate VP is opened by the inhaling pressure generated at the intake port 8c, and air enters in the cylinder 8a from outside. In the illustrated example, since the diameter of the tube connection tool TC mounted to the discharge port 8b is smaller than that of the intake port 8c, a large inhaling pressure (negative pressure) should not act on the opening of the vent hole 4e at the side of the liner passage 4b during the process of the piston 8d returning to its original position. If another valve plate VP which is the same as that described above is mounted at the side of the discharge port 8b, and the tube connection tool is mounted to the valve plate VP through a cap, it is of course possible to prevent the inhaling pressure (negative pressure) from acting on the opening of the vent hole 4e at the side of the liner passage 4b during the process of the piston 8d returning to its original position.

Figure 9:
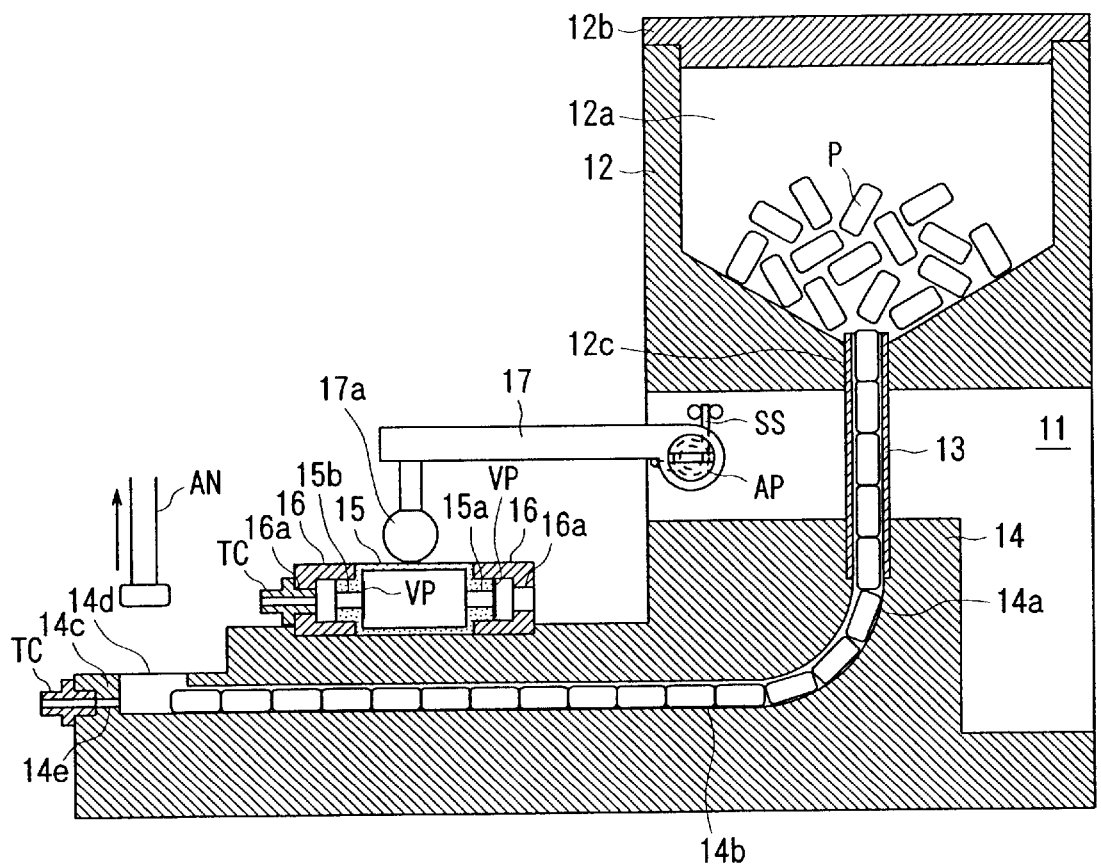
FIG. 9 is a view showing a second embodiment in which an inhaling pressure of an air bag is applied directly to chip components to transfer the components.

FIG. 9 is a view showing a second embodiment in which an inhaling pressure of an air bag is applied directly to chip components to transfer the chip components. In FIG. 9, the reference number 11 represents a frame, 12 represents a hopper, 13 represents a chute tube, 14 represents a component guide, 15 represents an air bag, 16 represents bag holding members, 17 represents an operation lever and AN represents a suction nozzle. For the purpose of convenience, the following description will be made assuming that left and right sides in FIG. 9 are front and rear sides, respectively.

The hopper 12 comprises a storage chamber 12a, a lid 12b capable of covering and opening an upper end opening of the storage chamber 12a, and a through hole 12c formed in a bottom of the storage chamber 12a. The hopper 12 is detachably mounted on the frame 11. A large number of one kind of prism or cylindrical chip components P such as a chip capacitor, a chip resistor and a chip inductor are stored in the storage chamber 12a in a bulk state. Of course, electronic components other than the chip component, for example, a composite component such as a LC filter and a network, and a integrated circuit component such as a semiconductor device can be handled as subject to be supplied if they have shapes as described above.

The chute tube 13 is made of metal pipe or hard resin pipe having a predetermined length. A lower end of the chute tube 13 is fixed to the component guide 14, and an upper end of the chute tube 13 is vertically inserted and fixed to the through hole 12c such that the upper end of the chute tube 13 substantially coincides with an upper end of the through hole 12c. A wall thickness of the chute tube 13 is smaller than the maximum length of an end surface of the chip component P to be supplied. In order to prevent the chip component from being caught, an inner edge of the upper end of the chute tube 13 is rounded or chamfered off if necessary. Further, the shape of cross section of an inner hole of the chute tube 13 is rectangular or circular slightly larger than the shape of the end surface of the chip component P to be supplied.

The component guide 14 comprises a curved passage 14a continued to the inner hole of the chute tube 13, and a horizontal liner passage 14b continued to the curved passage 14a. The component guide 14 is detachably mounted to the frame 11. The shape of cross section of each of the curved passage 14a and the liner passage 14b is rectangular, and is slightly larger than the shape of the end surface of the chip component P to be supplied. The curved passage 14a is curved at a constant curvature from a vertical direction to a horizontal direction through about 90° as viewed from a side. Further, the liner passage 14b is provided at its front end portion with a stopper 14c for stopping the chip component P which is arranged and transferred along the liner passage 14b, and a component picking out port 14d for exposing the chip component P which comes in contact with the stopper 14c. Furthermore, the stopper 14c is provided with a vent hole 14e extending from a front wall of the component guide 14 to a front end of the liner passage 14b. A tube connection tool TC is mounted to a front end of the vent hole 14e.

The air bag 15 is made of synthetic rubber such as SBR and silicon as well as shown in FIG. 2, and is hollow and has moderate resiliency. The air bag 15 is provided at its rear end with a discharge port 15a. The discharge port 15a is provided at its outside with a normally-closed valve plate VP for openably closing the discharge port 15a. The air bag 15 is formed at its front end with an intake port 15b. The intake port 15b is provided at its inside with a normally-closed valve plate VP for openably closing the intake port 15b. Each of the valve plates VP is made of resin thin plate having flexibility. A portion of the valve plate VP is fixed to the air bag 15, and swingable other portions of the valve plates close and open the discharge port 15a and intake port 15b. The air bag 15 discharges and draws air by a compression deformation and elastic returning ability of its own, but a spring member may be provided in the air bag for assisting the air intake by the elastic returning ability. In the second embodiment, the air bag 15 is used as a fluid unit for discharging and inhaling fluid by applying an external force.

The bag holding members 16 are formed into bottomed cylindrical shape made of metal or hard resin, and they are air-tightly fitted to outsides of the discharge port 15a and the intake port 15b, respectively. The air bag 15 is mounted on an upper surface of the component guide 14 in a state where two bag holding members 16 are fitted to front and rear portions of the air bag 15. Each of the bag holding members 16 is provided with a vent hole 16a, and in the illustrated example, a tube connection tool TC is mounted to the vent hole 16a at the side of the intake port 15b. This tube connection tool TC and another tube connection tool TC mounted to the vent hole 14e of the component guide 14 are connected to each other through a flexible air tube (not shown).

One end of the operation lever 17 is rotatably mounted on the frame 11 through an axial pin AP. A coil spring SS is mounted to the axial pin AP, the operation lever 17 is urged in a clockwise direction by a biasing force of the coil spring SS to keep its normal position horizontally. Further, the operation lever 17 is provided at its front end (operation part) with a spherical pushing portion 17a for pushing and deforming the air bag 15. The operation part of the operation lever 17 is pushed by a portion associatively connected to the suction nozzle AN or another driving equipment using a motor or the like as a driving force source.

Next, the operation of the apparatus of the second embodiment will be explained with reference to FIGS. 10 and 11.

As shown in FIG. 9, the chip components P in the storage chamber 12a are taken into the upper end opening of the chute tube 13 one by one in its longitudinal direction by receiving vibration from a vibration generator (not shown), and are moved in the chute tube 13 by their own weight while keeping the longitudinal direction and enter in the lower curved passage 14a. The chip components P entering the curved passage 14a advance in the curved passage 14a by their own weight, and during this process, the chip components P change their flowing direction from the vertical direction to the horizontal direction. After the flowing direction is changed, the chip components P enter the liner passage 14b.

Figure 10:
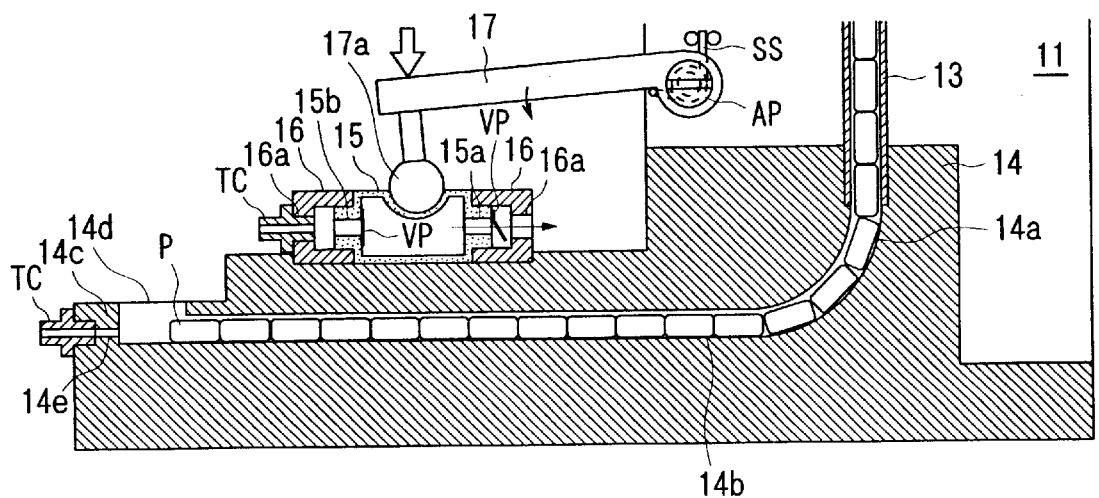
FIG. 10 is a view for explaining the operation of the second embodiment.

In this state, if the operation part of the operation lever 17 is pushed in a direction of the outline arrow as shown in FIG. 10, the operation lever 17 is turned in a counterclockwise direction against the biasing force of the coil spring SS, and the air bag 15 is crushed by the pushing portion 17a of the operation lever 17. At that time, the valve plate VP is opened by the discharge pressure from the discharge port 15a of the air bag 15, and the air in the air bag 15 is discharged outside.

Figure 11:
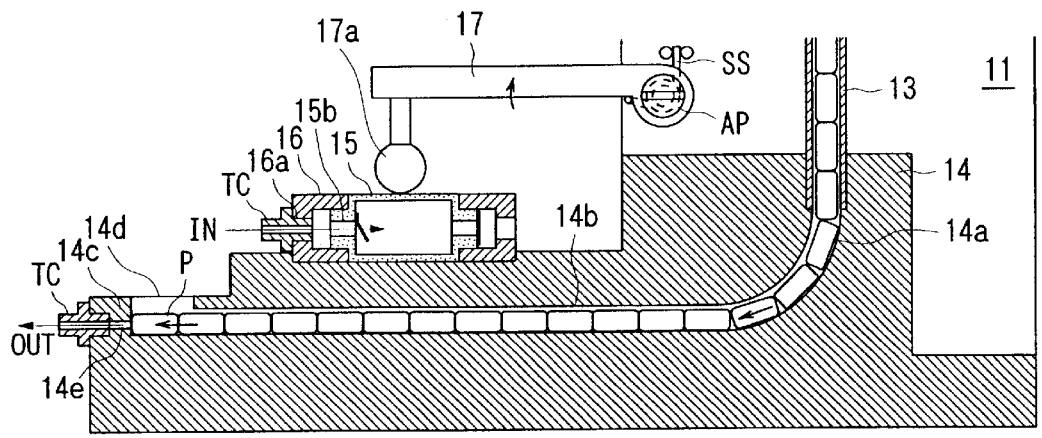
FIG. 11 is a view for explaining the operation of the second embodiment.

Thereafter, as shown in FIG. 11, if the pushing force against the operation part of the operation lever 17 is released, the operation lever 17 is returned to its original position by the biasing force of the coil spring SS, and the air bag 15 is simultaneously returned to its original shape by an elastic property of its own. During the process of the air bag 15 returning to its original shape, the valve plate VP is opened by the inhaling pressure (negative pressure) of the intake port 15b, the same inhaling pressure (negative pressure) is applied to the opening of the vent hole 14e at the side of the liner passage 14b, and the chip components P in the liner passage 14b are attracted by the inhaling pressure (negative pressure) and are transferred forward. The chip components P transferred forward in their arranged state are stopped when the foremost chip component comes in contact with the stopper 14c.

As described above, according to the component transfer mechanism of the second embodiment, the inhaling pressure (negative pressure) generated when the air bag 15 returns to its original shape is directly applied to the chip components P in the liner passage 14b, thereby transferring the components in the liner passage 14b. That is, since the components can be transferred only by releasing the pushing force acting on the air bag 15, a complicated lever mechanism as in the conventional apparatus is unnecessary, and the component transfer mechanism can be made compactly. Further, air piping can be freely designed, the existence and the position of the air bag 15 should not restrain and hinder the design, and high flexibility in design can be secured.

A valve structure such as a check valve comprising a spring-biased valve and a valve seat may be used instead of the valve plate VP mounted to the air bag 15. If the air bag 15 is directly pushed by a portion associatively connected to the suction nozzle AN or another driving equipment, the operation lever 17 in the second embodiment is unnecessary.

Figure 12:
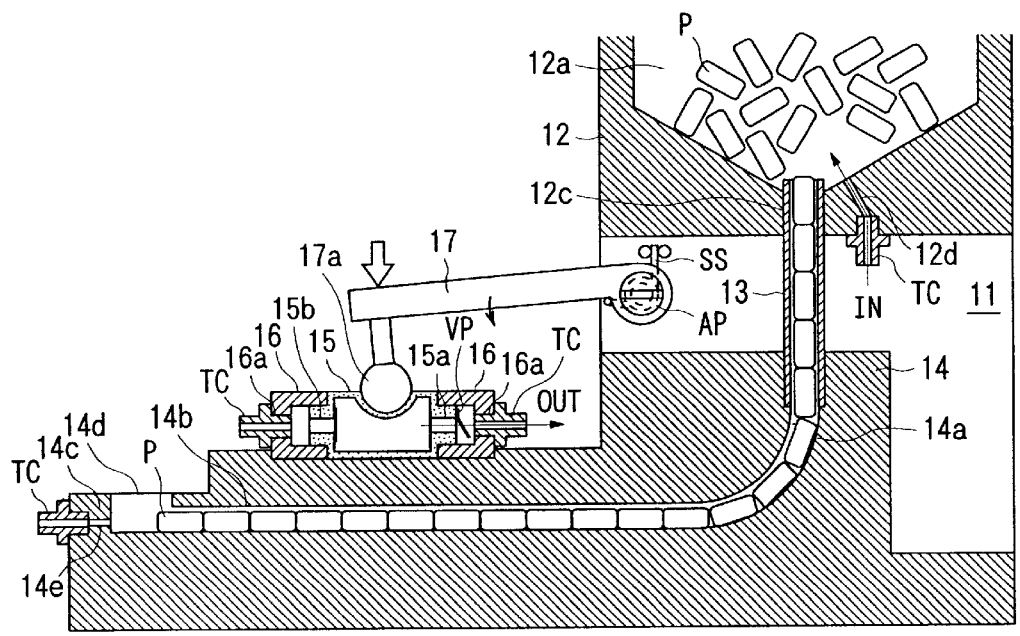
FIG. 12 is a view showing an example of structure of a component take-in mechanism applicable to the second embodiment.

Further, as shown in FIG. 12, if a vent hole 12d is formed from a lower surface of the hopper 12 to a bottom of the storage chamber 12a, preferably, in the vicinity of the upper end of the chute tube 13, and if a tube connection tool TC is mounted to the lower end of the vent hole 12d, another tube connection tool TC is mounted to the vent hole 16a at the side of the discharge port 15a of the air bag 15, and both the tube connection tools TC are connected to each other through an air tube (not shown), the discharge pressure (positive pressure) generated when the air bag 15 is crushed by the operation lever 17 acts directly on the chip components P in the storage chamber 12a to stir the chip components P in the storage chamber 12a, and the component can smoothly be taken into the upper end opening of the chute tube 13. According to this component take-in mechanism, since the components in the storage chamber 12a are stirred and the chip components P can be taken into the upper end opening of the chute tube 13 one by one, a complicated lever mechanism as in the conventional apparatus is unnecessary, and the component take-in mechanism can be made compactly. Further, air piping can be freely designed, the existence and the position of the air bag 15 should not restrain and hinder the design, and high flexibility in design can be secured. If a vent hole is formed in the upper portion of the storage chamber 12a so that the inhaling pressure (negative pressure) generated when the air bag 15 returns to its original shape is directly applied to the chip components P in the storage chamber 12a, it is of course possible to stir the components in the same manner as that described above.

Figure 13:
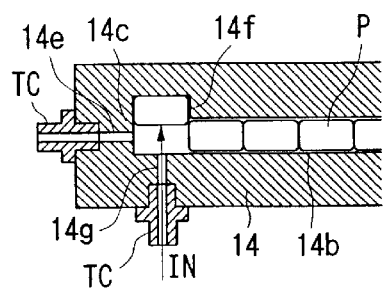
FIG. 13(A) is a view showing an example of structure of a component separating mechanism applicable to the second embodiment.
FIG. 13(B) is a view showing an example of structure of a succeeding component holding mechanism applicable to the second embodiment.
Figure 13:
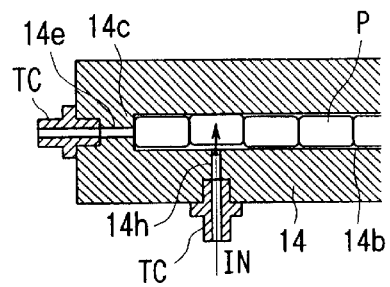

Further, as shown in FIG. 13(A), the liner passage 14a is provided at its side portion corresponding to the foremost chip component P with a recess 14f for taking in the foremost chip component P, a vent hole 14g is formed in the liner passage 14a at a position opposed to the recess 14f and a tube connection tool TC is connected to the vent hole 14g, another tube connection tool TC (not shown) is connected to a vent hole 16a at the side of the intake port 15b of the air bag 15, and both the tube connection tools TC are connected through an air tube (not shown). According to this structure, the discharging pressure (positive pressure) generated when the air bag 15 is crushed is applied to the opening of the vent hole 14g at the side of the recess 14f, thereby pushing the foremost chip component P which is stopped by the stopper 14c into the recess 14f, and the foremost chip component P can be separated from the succeeding chip components P. According to the component separating mechanism, since the foremost chip component P can be separated from the succeeding chip components P only by applying the pushing force acting on the air bag 15, a complicated lever mechanism as in the conventional apparatus is unnecessary, and the component separating mechanism can be made compactly. Further, air piping can be freely designed, the existence and the position of the air bag 15 should not restrain and hinder the design, and high flexibility in design can be secured.

Furthermore, as shown in FIG. 13(B), the liner passage 14a is provided at its side portion corresponding to a second chip component P with a vent hole 14h and a tube connection tool TC is connected to the vent hole 14h, another tube connection tool TC (not shown) is connected to a vent hole 16a at the side of the discharge port 15a of the air bag 15, and both the tube connection tools are connected through an air tube (not shown). According to this structure, if the discharging pressure (positive pressure) generated when the air bag 15 is crushed is applied to the opening of the vent hole 14h at the side of the liner passage 14a, the second chip component P can be sucked and held by the side surface of the liner passage 14a. According to this succeeding component holding mechanism, since the second chip component P can be held at a stop position only by applying the pushing force to the air bag 15, when the foremost component P is taken out by the suction nozzle AN, the second chip component P should not be taken out together or inclined. If this succeeding component holding mechanism is used in combination with the component separating mechanism shown in FIG. 13(A), it is possible to take out the foremost chip component P more stably.

Figure 14:
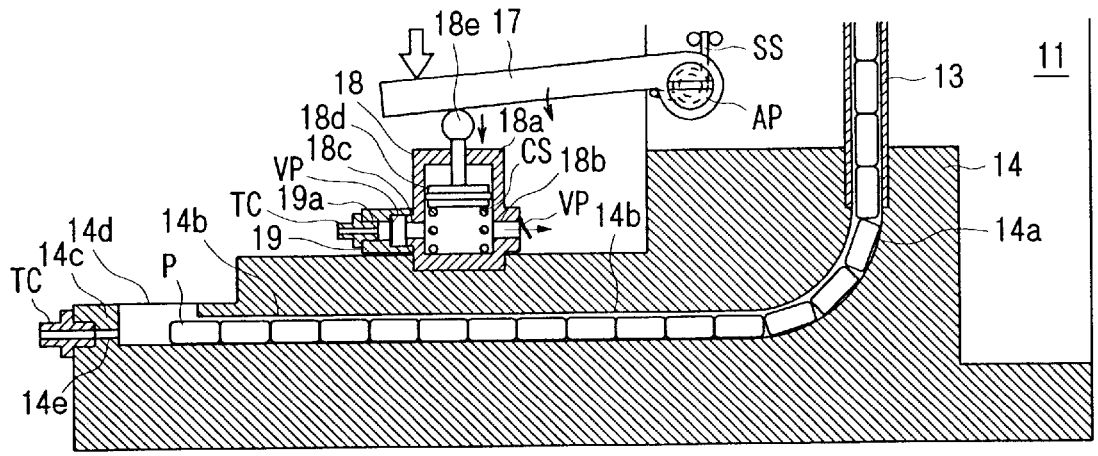
FIG. 14 is a view showing an example of structure using an air cylinder instead of the air bag in the second embodiment.

Although the air bag 15 is used as the fluid unit in the second embodiment, the air bag 15 and the bag holding members 16 may be deleted, and an air cylinder 18 shown in FIG. 14 may be used as the fluid unit. The air cylinder 18 has a cylinder 18a having a discharge port 18b and an intake port 18c. A cap 19 having a vent hole 19a is air-tightly fitted to the intake port 18c. A tube connection tool TC is mounted to the vent hole 19a. The tube connection tool TC and another tube connection tool TC provided at the vent hole 14e of the component guide 14 are connected to each other through an air tube (not shown). A normally-closed valve plate VP is provided at inner side of the vent hole 19a of the cap 19 for openably covering the vent hole 19a, and another normally-closed valve plate VP is provided on the discharge port 18b for openably covering the discharge port 18b. A piston 18d is movably inserted in the cylinder 18a airtightly. A rod 18e having a spherical head is connected to the piston 18d and is projected outward from the cylinder 18a. A coil spring CS for upwardly biasing the piston 18d is disposed in the cylinder 18a.

As shown in FIG. 14, if the operation part of the operation lever 17 is pushed in the direction of outline arrow, the operation lever 17 is rotated in the counterclockwise direction against the biasing force of the coil spring SS, and the rod 18e and the piston 18d of the air cylinder 18 are moved downward against the biasing force of the coil spring CS. At that time, the valve plate VP is opened by the discharging pressure from the discharge port 18b of the air cylinder 18, and air in the air cylinder 18 is discharged outside.

Figure 15:
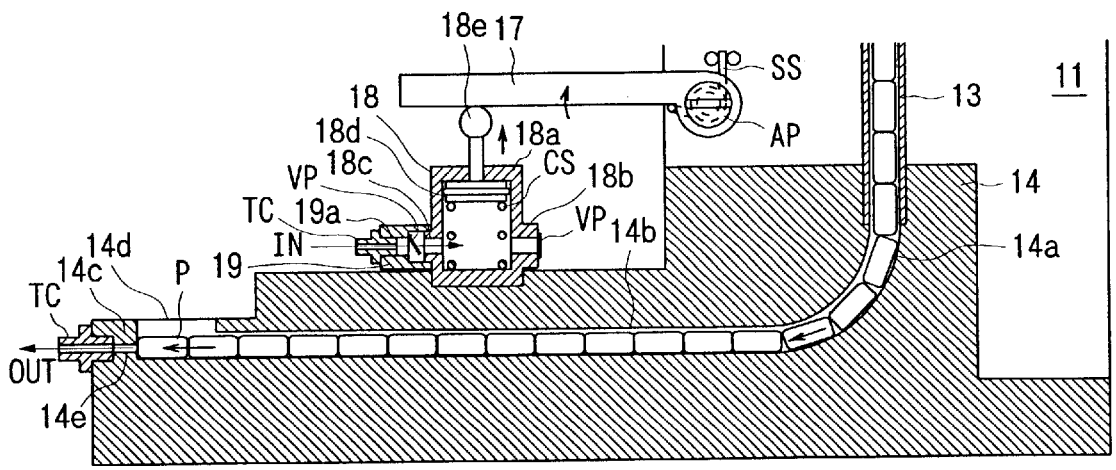
FIG. 15 is a view for explaining the operation of the apparatus shown in FIG. 14.

After that, if the pushing force against the operation part of the operation lever 17 is released as shown in FIG. 15, the operation lever 17 returns to its original position by the biasing force of the coil spring SS, and the rod 18e and the piston 18d of the air cylinder 18 return to their original positions by the biasing force of the coil spring CS. During the process of the piston 18d returning to its original position, the valve plate VP is opened by the inhaling pressure generated at the intake port 18c, the same inhaling pressure (negative pressure) acts on the opening of the vent hole 14e at the side of the liner passage 14b, and the chip components P in the liner passage 14b are attracted by the inhaling pressure (negative pressure) at that time, and are transferred forward. The chip components P transferred forward in their arranged state are stopped when the foremost chip component comes in contact with the stopper 4c.

Figure 16:
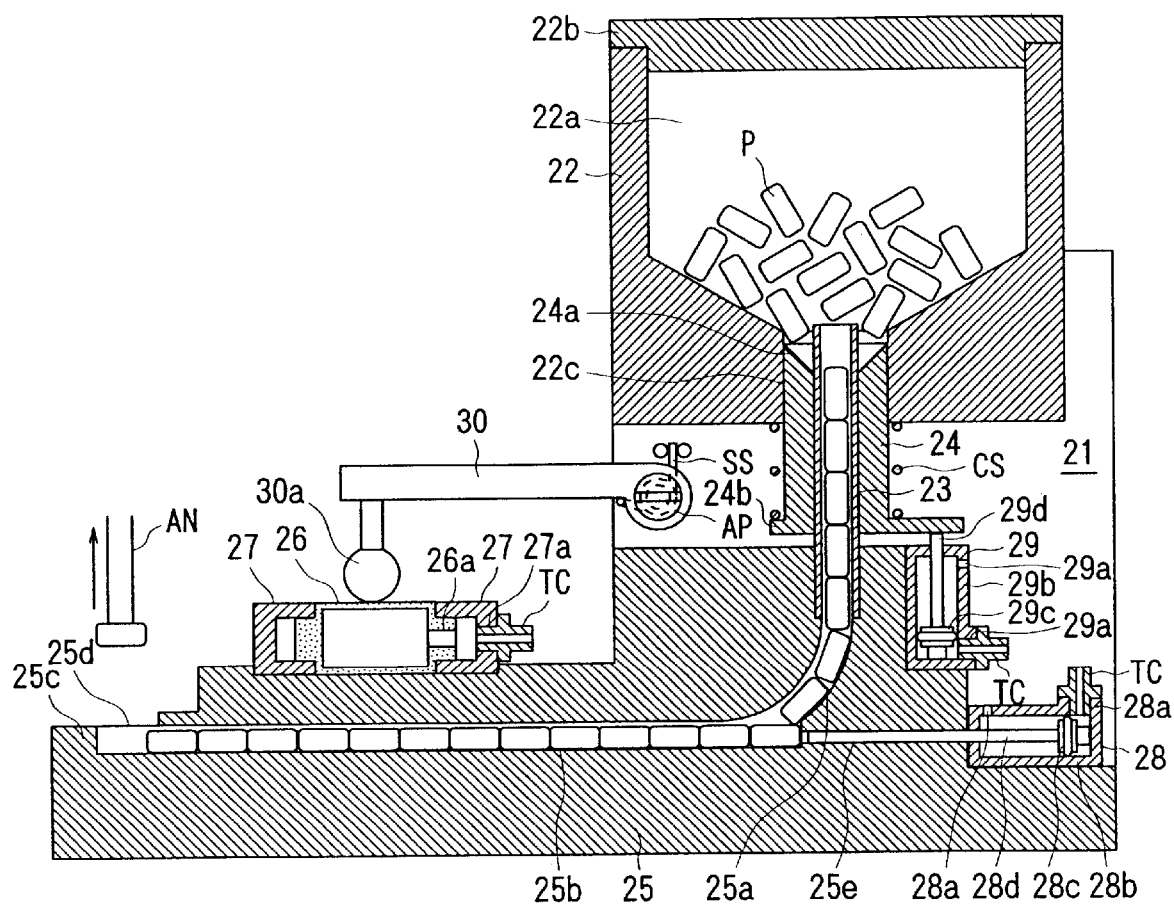
FIG. 16 is a view showing a third embodiment in which a component transfer member is operated with use of an air actuator worked by a discharging pressure of an air bag, thereby transferring the components.

FIG. 16 is a view showing a third embodiment in which a component transfer member is operated with use of an air actuator by a discharging pressure of an air bag. In FIG. 16, the reference number 21 represents a frame, 22 represents a hopper, 23 represents a chute tube, 24 represents a stirring member, 25 represents a component guide, 26 represents an air bag, 27 represents bag holding members, 28 represents an air cylinder for transferring components, 29 represents an air cylinder for stirring the components, 30 represents an operation lever, and AN represents a suction nozzle for picking the component out. For the purpose of convenience, the following description will be made assuming that left and right sides in FIG. 16 are front and rear sides, respectively.

The hopper 22 comprises a storage chamber 22*a*, a lid 22*b* capable of covering and opening an upper end opening of the storage chamber 22*a*, and a through hole 22*c* formed in a bottom of the storage chamber 22*a*. The hopper 22 is detachably mounted to the frame 21. A large number of one kind of prism or cylindrical chip components P such as a chip capacitor, a chip resistor and a chip inductor are stored in the storage chamber 22*a* in a bulk state. Of course, electronic components other than the chip component, for example, a composite component such as a LC filter and a network, and an integrated circuit component such as a semiconductor device can be handled as subject to be supplied if they have shapes as described above.

The chute tube 23 is made of metal pipe or hard-resin pipe having a predetermined length. A lower end of the chute tube 23 is fixed to the component guide 25, and an upper end of the chute tube 23 is vertically inserted to the central portion of the through hole 22*c* such that the upper end of the chute tube 23 substantially coincides with an upper end of the through hole 22*c*. A wall thickness of the chute tube 23 is smaller than the maximum length of an end surface of the chip component P to be supplied. In order to prevent the chip component from being caught, an inner edge of the upper end of the chute tube 23 is rounded or chamfered off if necessary. Further, the shape of cross section of an inner hole of the chute tube 23 is rectangular or circular slightly larger than the shape of the end surface of the chip component P to be supplied.

The stirring member 24 is made of metal pipe or hard resin pipe having a predetermined length, its outward appearance being slightly smaller than the through hole 22*c*, and its inward appearance being slightly greater then the chute tube 23. The stirring member 24 is vertically movably disposed in an annular space between the through hole 22*c* and the chute tube 23 while keeping a positional relation that an upper end of the stirring member 24 is slightly lower than an upper end of the through hole 22*c* in a lowered state of the stirring member. A wall thickness of the stirring member 24 is greater than the maximum length of an end surface of the chip component P to be supplied. The stirring member 24 is provided at its upper end with a conical guide surface 24*a*, and at its lower end with a flange 24*b*. A coil spring CS is stretched between the flange 24*b* and a lower surface of the hopper 22.

The component guide 25 comprises a curved passage 25*a* continued to the inner hole of the chute tube 23, and a horizontal liner passage 25*b* continued to the curved passage 25*a*. The component guide 25 is detachably mounted to the frame 21. The shape of cross section of each of the curved passage 25*a* and the liner passage 25*b* is rectangular, and is slightly larger than the shape of the end surface of the chip component P to be supplied. The curved passage 25*a* is curved at a constant curvature from a vertical direction to a horizontal direction through about 90° as viewed from a side. Further, the liner passage 25*b* is provided at its front end portion with a stopper 25*c* for stopping the chip components P which is arranged and transferred along the liner passage 25*b*, and a component picking out port 25*d* for exposing the foremost chip component P which comes in contact with the stopper 25*c*. Furthermore, the component guide 25 is formed at its rear portion with a through hole 25*e* extending from the rear wall of the component guide 25 to the rear end of the linear passage 25*b*.

Figure 17:
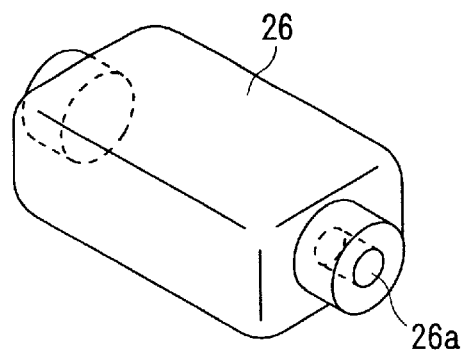
FIG. 17 is a perspective view of the air bag used in the third embodiment.

The air bag 26 is made of synthetic rubber such as SBR and silicon as shown in FIG. 17, and is hollow and has moderate elasticty. The air bag 26 is provided at its rear end with a vent port 26*a* for inhaling and discharging air. The air bag 26 discharges and draws air by a compression deformation and elastic returning ability of its own, but a spring member may be provided in the air bag for assisting the air intake by the elastic returning ability. In the third embodiment, the air bag 26 is used as a fluid unit for discharging and inhaling fluid by applying an external force.

The bag holding members 27 are formed into bottomed cylindrical shape made of metal or hard resin, and they are fitted to the opposite ends of the air bag 26. The air bag 26 is mounted on an upper surface of the component guide 25 in a state where the two bag holding members 27 are mounted to the front and rear portions of the air bag 26. A vent hole 27*a* is formed in the bag holding member 27 at the side of the vent port 26*a*, and a tube connection tool TC is mounted to the vent hole 27*a*. This tube connection tool TC, another tube connection tool TC mounted to the air cylinder 28 for transferring the components and another tube connection tool TC mounted to the air cylinder 29 for stirring the components are connected together with use of a flexible air tube (not shown).

The air cylinder 28 for transferring the components includes a cylinder 28*b* having two vent ports 28*a*, a piston 28*c* air-tightly movably inserted in the cylinder 28*b*, and a rod 28*d* connected to the piston 28*c*. The tube connection tool TC is mounted to the rear vent port 28*a*. This air cylinder 28 is mounted to the component guide 25 in a state where the rod 28*d* is inserted in the through hole 25*e* of the component guide 25. In the illustrated example, the rod 28*d* itself is used as a component transfer member.

The air cylinder 29 for stirring the component includes a cylinder 29*b* having two vent ports 29*a*, a piston 29*c* air-tightly movably inserted in the cylinder 29*b*, and a rod 29*d* connected to the piston 29*c*. The tube connection tool TC is mounted to the lower vent port 29*a*. This air cylinder 29 is mounted to the component guide 25, and a tip end of the rod 29*d* is connected to the lower surface of the stirring member 24.

One end of the operation lever 30 is rotatably mounted to the frame 21 through an axial pin AP. A coil spring SS is mounted to the axial pin AP, the operation lever 30 is biased in a clockwise direction by a biasing force of the coil spring SS to keep its normal position horizontally. Further, the operation lever 30 is provided at its front end (operation part) with a spherical pushing portion 30*a* for pushing and deforming the air bag 26.

Next, the operation of the apparatus of the third embodiment will be explained with reference to FIGS. 18 and 19.

Figure 18:
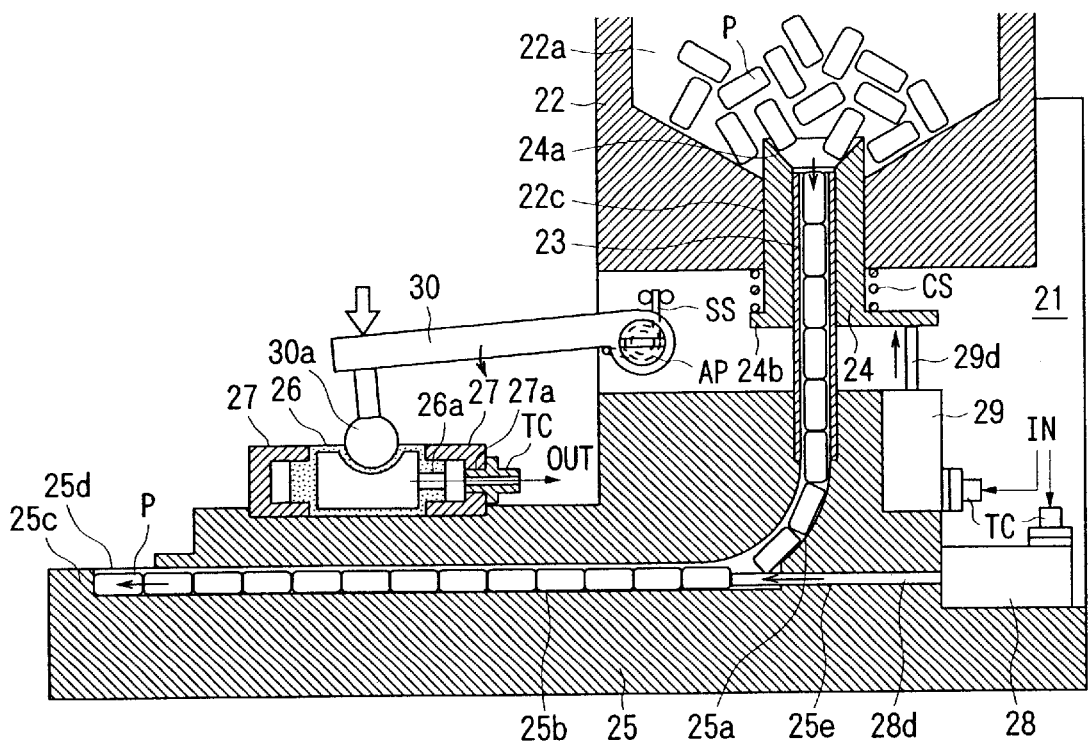
FIG. 18 is a view for explaining the operation of the third embodiment.
Figure 19:
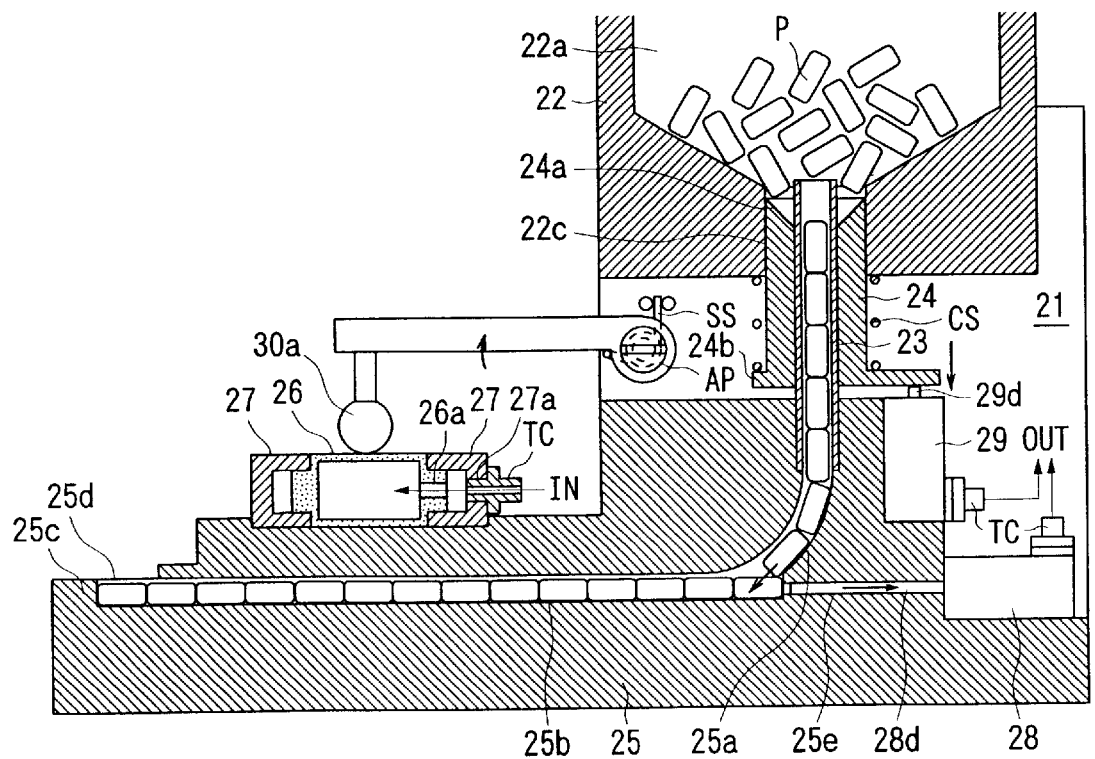
FIG. 19 is a view for explaining the operation of the third embodiment.

If the operation part of the operation lever 30 is pushed in a direction of the outline arrow as shown in FIG. 18, the operation lever 30 is turned in a counterclockwise direction against the biasing force of the coil spring SS, and the air bag 26 is crushed by the pushing portion 30*a* of the operation lever 30. With this operation, air discharged from the vent port 26*a* of the air bag 26 is sent to the component transfer air cylinder 28 and the component stirring air cylinder 29 through an air tube (not shown).

If the air is sent to the component stirring air cylinder 29, the piston 29c and the rod 29d are moved upward, the stirring member 24 is pushed up by the rod 29 and rises against the biasing force of the coil spring CS. With this operation, an upper end of the stirring member 24 enters the storage chamber 22a and the chip components P are stirred, and with this stirring operation of the components, the chip components P in the storage chamber 22a are taken into the upper opening of the chute tube 23 one by one in a longitudinal direction, and are moved in the chute tube 23 by their own weight while keeping the longitudinal direction and enter in the lower curved passage 25a. The chip components P entering the curved passage 25a advance in the curved passage 25a by their own weight, and during this process, the chip components P change their flowing direction from the vertical direction to the horizontal direction through about 90°. After the flowing direction is changed, the chip components P enter the liner passage 25b.

On the other hand, if the air is sent to the component transferring air cylinder 28, the piston 28c and the rod 28d are moved forward. With this movement, a tip end of the rod 28d projects into the linear passage 25b, and the chip components P entering the linear passage 25b are pushed by the rod 28d and transferred forward.

After that, if the pushing force against the operation part of the operation lever 30 is released, the operation lever 30 returns to its original position by the biasing force of the coil spring SS, and the air bag 26 simultaneously returns to its original shape by its own elastic force. During the process of air bag 26 returning to its original shape, the inhaling pressure (negative pressure) generated at the vent portion 26a acts on the component stirring air cylinder 29 through the air tube, the piston 29c and the rod 29d return to their original positions by the inhaling pressure (negative pressure), and the stirring member 24 is lowered by the biasing force of the coil spring CS and is returned to its original position. Similarly, the inhaling pressure (negative pressure) generated at the vent port 26a also acts on the component transferring air cylinder 28 through the air tube, and the piston 28c and the rod 28d return to their original positions by the inhaling pressure (negative pressure).

That is, if the air bag 26 is crushed by the pushing portion 30a of the operation lever 30 just after the foremost chip component P is taken out by the suction nozzle AN through the component picking out port 25d, the chip components P in the storage chamber 22a are stirred by the stirring member 24 and are taken into the chute tube 23 one by one in a predetermined direction, and the chip components P which are sent to the linear passage 25b through the chute tube 23 are pushed by the rod 28 and transferred forward. The chip components P transferred forward in their arranged state are stopped when the foremost chip component comes in contact with the stopper 25c.

As described above, according to the component transfer mechanism of the third embodiment, the rod 28d (component transfer member) of the component transfer air cylinder 28 is operated by the discharge pressure (positive pressure) generated when the air bag 26 is crushed, and the components in the linear passage 25b can be transferred. That is, since the components in the linear passage 25b can be transferred only by applying the pushing force to the air bag 26, a complicated lever mechanism as in the conventional apparatus is unnecessary, and the component transfer mechanism can be made compactly. Further, air piping can be freely designed, the existence and the position of the air bag 26 should not restrain and hinder the design, and high flexibility in design can be secured.

According to the component take-in mechanism of the third embodiment, the stirring member 24 is operated through the component stirring air cylinder 28 by the discharge pressure (positive pressure) generated when the air bag 26 is crushed, thereby stirring the components in the storage chamber 22a for smoothly taking the components into the chute tube 23. That is, since the components in the storage chamber 22a can be stirred and the chip components P can be taken into the upper opening of the chute tube 23 one by one, only by applying the pushing force to the air bag 25, a complicated lever mechanism as in the conventional apparatus is unnecessary, and the component take-in mechanism can be made compactly. Further, air piping can be freely designed, the existence and the position of the air bag 26 should not restrain and hinder the design, and high flexibility in design can be secured.

Further, according to the third embodiment, since the air bag 26 has the single vent port 26a, the valve plate VP of the air bag 5 shown in FIG. 2 is unnecessary, and the structure of the air bag itself can be simplified. Further, since the air bag 26 and the two air cylinders 28 and 29 can be made as a closed-circuit, not only gas other than air, but also liquid such as water can be used as a power transmitting medium. It is of course possible to obtain the same effect even if a tightly closed cylinder is used as the fluid unit instead of the air bag 26.

If the air bag 26 is directly pushed by a portion associatively connected to the suction nozzle AN or another driving equipment, the operation lever 30 in the third embodiment is unnecessary.

Figure 20:
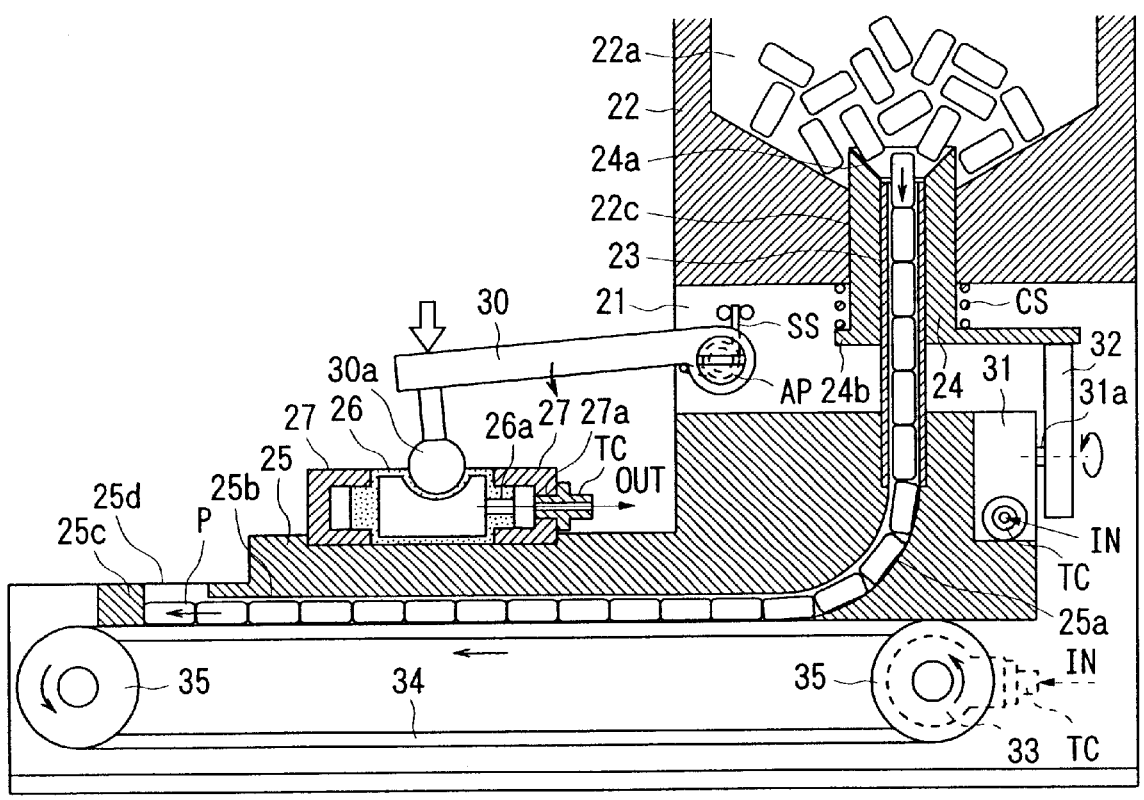
FIG. 20 is a view showing an example of structure using an air motor instead of a component stirring air cylinder in the third embodiment.
Figure 21:
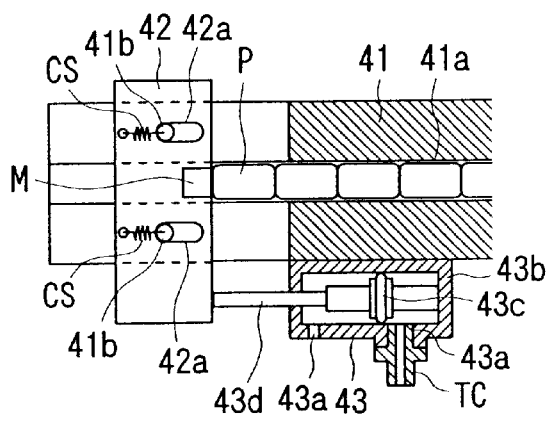
FIGS. 21(A) and 21(B) are a view showing an example of structure of a component separating mechanism applicable to the first to third embodiments, and a view for explaining the operation thereof.
Figure 21:
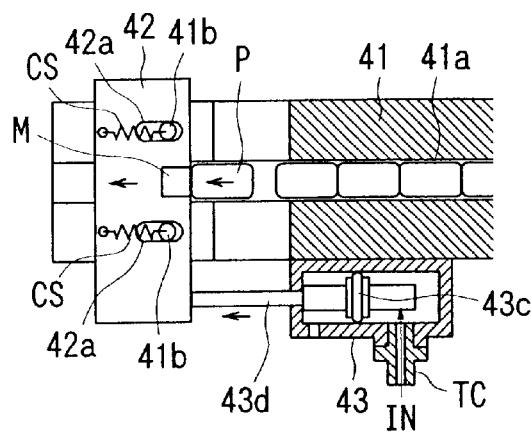

Although the component stirring air cylinder 29 and the component transferring air cylinder 28 are used in the third embodiment, both the air cylinders 28 and 29 may be deleted, and a component stirring air motor 31 and a component transferring air motor 33 shown in FIG. 20 may be used instead. Both the air motors 31 and 33 make it possible to rotate in a predetermined direction by sending air to an intake port.

As shown in FIG. 20, a tube connection tool TC is mounted to an intake port of the component stirring air motor 31, and an eccentric cam 32 is mounted to a rotation shaft 31a of the air motor 31 such that the eccentric cam 32 contacts with a lower surface of the stirring member 24. That is, if the rotation shaft 31a of the air motor 31 is rotated through a predetermined angle by utilizing the discharge pressure (positive pressure) generated when the air bag 26 is crushed, the stirring member 24 can rise from the lower position by the eccentric cam 32 which is synchronously rotated.

On the other hand, a rotation shaft (not shown) of the component transferring air motor 33 is connected to one of front and rear pulleys 35 around which a belt 34 is wound. A lower surface of the linear passage 25b of the component guide 25 is opened, and such opened lower surface is closed by the belt 34. That is, if the rotation shaft of the air motor 33 is rotated through a predetermined angle by utilizing the discharge pressure (positive pressure) generated when the air bag 26 is crushed, the belt 34 is rotated and moved by the pulleys 35 which are rotated synchronously, and the chip components P in the linear passage 25b can be transferred forward by the belt 34.

Some component separating mechanisms applicable to the first to third embodiments will be shown below with reference to FIGS. 21 to 25.

In a component separating mechanism shown in FIGS. 21(A) and 21(B), a front end of a linear passage 41a of a component guide 41 is opened, and a movable component stopper 42 is provided in front of the front end. The component stopper 42 has elongated holes 42a through which guide pins 41b of the component guide 41 are passed so that the component stopper 42 can move forward and backward. The component stopper 42 is biased by coil springs CS, and a rear surface of the component stopper 42 is abutted against the front end of the linear passage 41a. Further, a magnet M comprising rare-earth permanent magnet is embedded in a portion of the component stopper 42 facing the foremost chip component P. Further, an air cylinder 43 operated by a discharge pressure (positive pressure) of an air bag or an air cylinder is mounted to a side of the component guide 41. The air cylinder 43 includes a cylinder 43b having two vent ports 43a, a piston 43c air-tightly and movably inserted in the cylinder 43b, and a rod 43d connected to the piston 43c. A tube connection tool TC is mounted to the rear vent port 43a, and a tip end of the rod 43d contacts with a rear surface of the component stopper 42. If a discharge pressure (positive pressure) of the air bag or the air cylinder is applied to the right vent port 43a of the air cylinder 43 in a state shown in FIG. 21(A), the piston 43c and the rod 43d are moved leftward as shown in FIG. 21(B), the component stopper 42 is pushed by the rod 43d and moved forward, and the foremost chip component P which is adhered to the magnet M is moved forward together with the component stopper 42, and is separated from the second chip component P.

Figure 22:
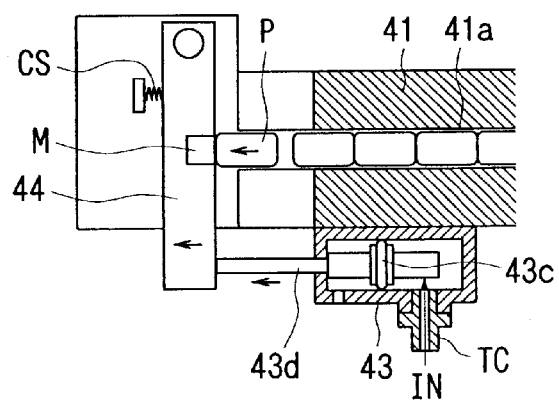
FIG. 22 is a view showing another example of structure of the component separating mechanism applicable to the first to third embodiments.
Figure 23:
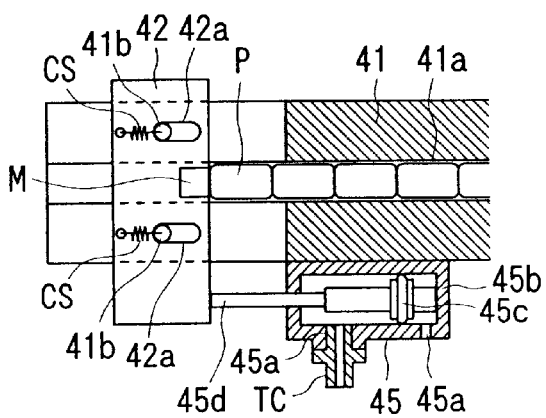
FIGS. 23(A) and 23(B) are a view showing another example of structure of the component separating mechanism applicable to the first to third embodiments, and a view for explaining the operation thereof.
Figure 23:
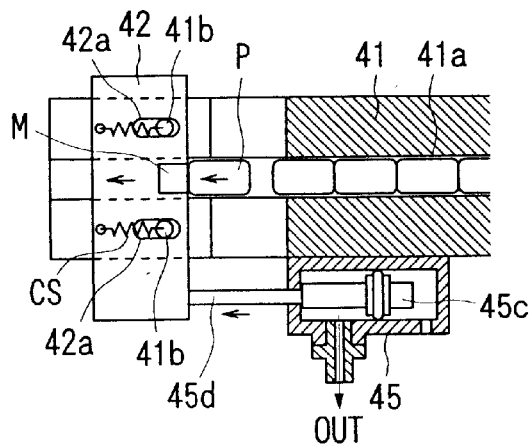
Figure 24:
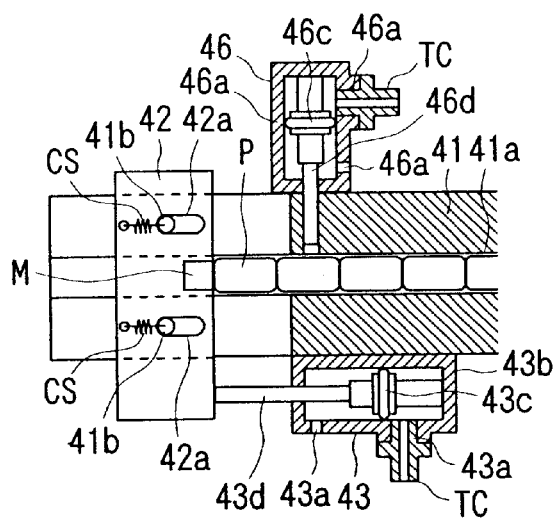
FIGS. 24(A) and 24(B) are a view showing another example of structure of the component separating mechanism applicable to the first to third embodiments, and a view for explaining the operation thereof.
Figure 24:
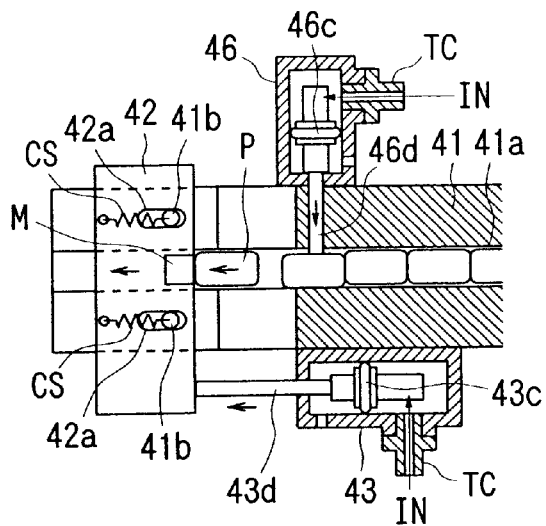
Figure 25:
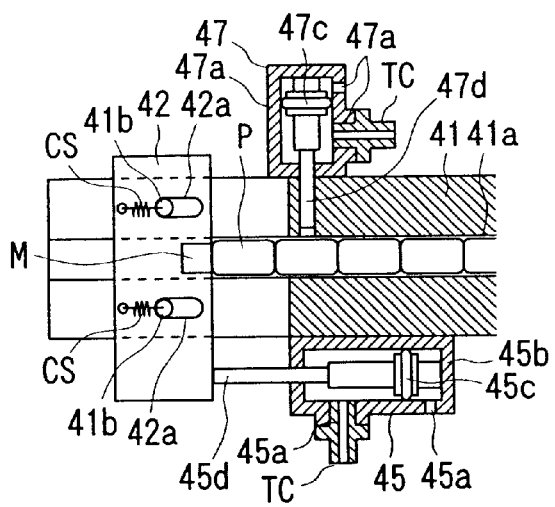
FIGS. 25(A) and 25(B) are a view showing another example of structure of the component separating mechanism applicable to the first to third embodiments, and a view for explaining the operation thereof.
Figure 25:
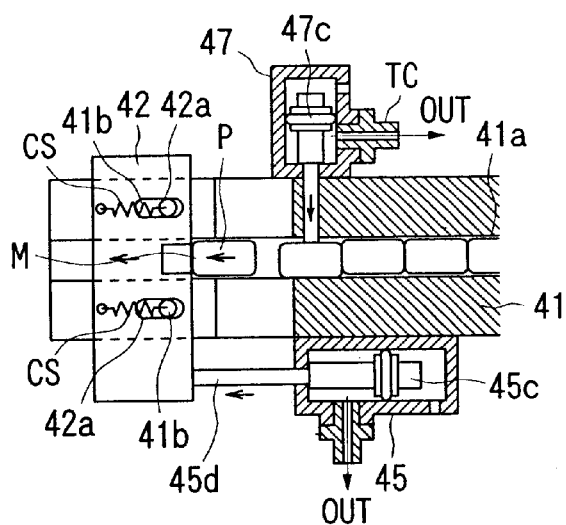

A component separating mechanism shown in FIG. 22 is different from that shown in FIGS. 21(A) and 21(B) in the structure of the component stopper. This stopper 44 is mounted on the component guide 41 such that the stopper 44 can rotate on one end thereof. The stopper 44 is biased by the coil spring CS and a rear surface of the stopper 44 is abutted against the front end of the linear passage 41a. If a discharge pressure (positive pressure) of the air bag or the air cylinder is applied to the right vent port 43a of the air cylinder 43, the piston 43c and the rod 43d move forward, and the component stopper 44 is rotated in the clockwise direction by the pushing force of the rod 43d, and the foremost chip component P which is adhered to the magnet M is moved forward together with the component stopper 44, and is separated from the second chip component P.

A component separating mechanism shown in FIGS. 23(A) and 23(B) is different from that shown in FIGS. 21(A) and 21(B) in the structure of the air cylinder. This air cylinder 45 includes a cylinder 45b having two vent ports 45a, a piston 45c air-tightly and movably inserted in the cylinder 45b, and a rod 45d connected to the piston 45c. A tube connection tool TC is mounted to the front vent port 45a, and a tip end of the rod 45d contacts with a rear surface of the component stopper 42. If an inhaling pressure (negative pressure) of the air bag or the air cylinder is applied to the left vent port 45a of the air cylinder 45 in a state shown in FIG. 23(A), the piston 45c and the rod 45d are moved leftward against the biasing force of the coil spring CS as shown in FIG. 23(B), the component stopper 42 is pushed by the rod 45d and moved leftward, and the foremost chip component P which is adhered to the magnet M is moved forward together with the component stopper 42, and is separated from the second chip component P.

A component separating mechanism shown in FIGS. 24(A) and 24(B) is obtained by adding an air cylinder for holding the second chip component P to the component separating mechanism shown in FIGS. 21(A) and 21(B). This air cylinder 46 includes a cylinder 46b having two vent ports 46a, a piston 46c air-tightly and movably inserted in the cylinder 46b, and a rod 46d connected to the piston 46c. A tube connection tool TC is mounted to the upper vent port 46a as viewed in the drawings. The linear passage 41a is provided at its side portion corresponding to the second chip component P of the component guide 41 with a through hole (having no reference number), and a rod 46d is inserted in the through hole. If a discharge pressure (positive pressure) of the air bag or the air cylinder is applied to a rear vent port 43a of the air cylinder 43, and a discharge pressure (positive pressure) is applied to the upper vent port 46a of the air cylinder 46 as viewed in the drawings in the state shown in FIG. 24(A), the piston 43c and the rod 43d are moved forward as shown in FIG. 24(B), and the component stopper 42 is pushed by the rod 43d and moved forward, and the foremost chip component P which is adhered to the magnet M is moved forward together with the component stopper 42, and is separated from the second chip component P. Simultaneously, the piston 46c and the rod 46d are moved downward as viewed in the drawings, and the second chip component P is pushed against and held by an inner surface of the linear passage 41a by the rod 46 projecting into the linear passage 41a.

A component separating mechanism shown in FIGS. 25(A) and 25(B) is obtained by adding an air cylinder for holding the second chip component P to the component separating mechanism shown in FIGS. 23(A) and 23(B). This air cylinder 47 includes a cylinder 47b having two vent ports 47a, a piston 47c air-tightly and movably inserted in the cylinder 47b, and a rod 47d connected to the piston 47c. A tube connection tool TC is mounted to the lower vent port 47a as viewed in the drawings. The linear passage 41a is provided at its side portion corresponding to the second chip component P of the component guide 41 with a through hole (having no reference number), and a rod 47d is inserted in the through hole. If an inhaling pressure (negative pressure) of the air bag or the air cylinder is applied to a front vent port 45a of the air cylinder 45 and to the lower vent port 47a of the air cylinder 47 as viewed in the drawings in the state shown in FIG. 25(A), the piston 45c and the rod 45d are moved forward as shown in FIG. 25(B), and the component stopper 42 is pushed by the rod 45d and moved forward, and the foremost chip component P which is adhered to the magnet M is moved forward together with the component stopper 42, and is separated from the second chip component P. Simultaneously, the piston 47c and the rod 47d are moved downward as viewed in the drawings, and the second chip component P is pushed against and held by an inner surface of the linear passage 41a by the rod 47 projecting into the linear passage 41a.

Figure 26:
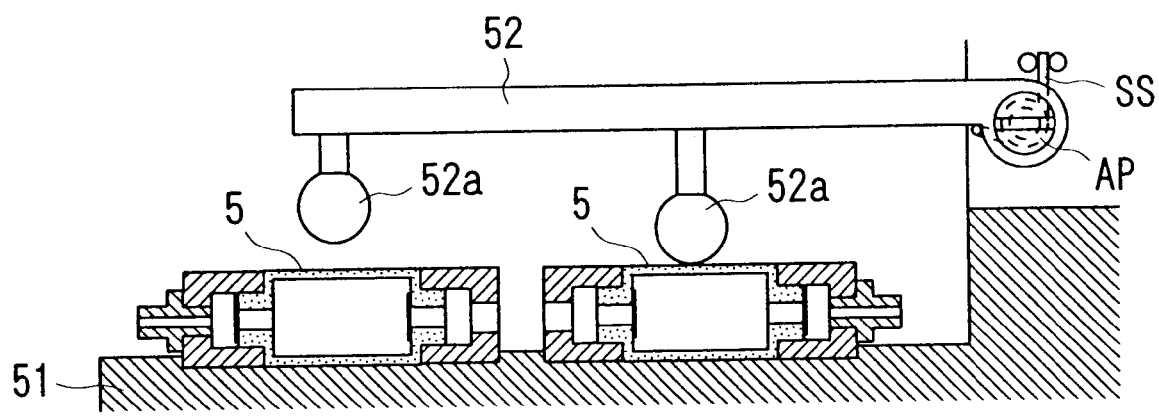
FIG. 26 is a view showing an example of structure using two or more air bags.
Figure 27:
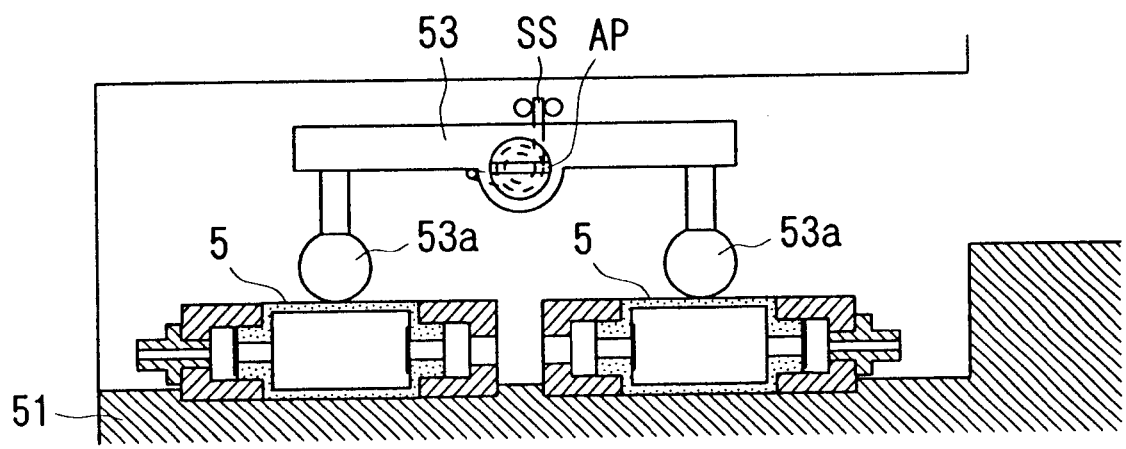
FIG. 27 is a view showing another example of structure using two or more air bags.

FIGS. 26 and 27 show examples of structures using two or more fluid units. In FIG. 26, two air bags 5 used in the first embodiment are disposed on a component guide 51, and two pushing portions 52a corresponding to the air bags 5 are mounted to an operation lever 52 which is rotated on its one end. If lengths and sizes of both the pushing portions 52a are different as shown in FIG. 26, when the operation part of the operation lever 52 is downwardly pushed, it is possible to differ the crushing timings of both the air bags 5. In FIG. 27, two air bags 5 used in the first embodiment are disposed on a component guide 51, and two pushing portions 53a corresponding to the air bags 5 at opposite ends of an operation lever 53 which is rotated on its central portion. Of course, it is possible to control the timing even if the air bag 26 shown in FIG. 17 or an air cylinder is used instead of the air bag 5.

In this manner, if two or more fluid units such as air bags and air cylinders are used, it is possible to optionally differ the operating timings such as transfer, taking in and separation of the components described above, and to reliably obtain a desired operation, by utilizing the fluid units.

The preferred embodiments described in the present specification are examples only, and the present invention should not be limited to these embodiments only. The scope of the present invention is described in the attached claims, and all the modifications readable in the claims should be included in the present invention.

What is claimed is:

1. An electronic component feeding apparatus, comprising:
    a transfer passage for transferring electronic components;
    a stopper for stopping advancement of the electronic components in the transfer passage;
    a source of varying pressure;
    a structure for removing the foremost component one at a time from the transfer passage and wherein the foremost component is at the stopper; and
    the stopper being connected in fluid flow relation to the source of varying pressure and including an arrangement responsive to the varying pressure source for separating the foremost component in the transfer passage from other components in the transfer passage and for facilitating removal by the removing structure of the foremost component from the transfer passage, the arrangement being arranged to separate the component by moving the component in a direction extending (i) in the same direction as the path of movement of the components in the transfer passage and (ii) at a right angle to the removal direction of the component from the transfer passage by the removing structure.

2. The apparatus of claim 1 wherein the arrangement is arranged to separate the foremost component by moving the foremost component in a direction extending (i) at a right angle to the path of movement of the components in the transfer passage and (ii) at a right angle to the removal direction of the foremost component from the transfer passage by the removing structure.

3. The apparatus of claim 1 wherein the arrangement is arranged to separate the component that is next to and behind the foremost component by moving the component that is next to and behind the foremost component in a direction extending (i) at a right angle to the path of movement of the components that are in the transfer passage and (ii) at a right angle to the removal direction of the component that is next to and behind the foremost components from the transfer passage by the removing structure.

4. An electronic component feeding apparatus, comprising:
    a transfer passage for transferring electronic components;
    a stopper for stopping advancement of the electronic components in the transfer passage;
    a source of varying pressure;
    a structure for removing one component at a time from the transfer passage and wherein the removed component is at the stopper; and
    the stopper being connected in fluid flow relation to the source of varying pressure and including an arrangement responsive to the varying pressure source for separating one of the components in the transfer passage from other components in the transfer passage and for facilitating removal by the removing structure of one component at a time from the transfer passage, the arrangement being arranged to separate the component by moving the component in a direction extending (i) at a right angle to the path of movement of the components in the transfer passage and (ii) at a right angle to the removal direction of the component from the transfer passage by the removing structure.

5. The apparatus of claim 4 wherein the arrangement is arranged to apply a fluid force to the moved component.

6. The apparatus of claim 5 wherein the arrangement is arranged to apply an inhaling force resulting directly from pressure variations of the varying pressure source to the separated component.

7. The apparatus of claim 5 wherein the arrangement is arranged to apply a discharge force resulting directly from pressure variations of the varying pressure source to the separated components.

8. The apparatus of claim 6 wherein the arrangement is arranged to separate the foremost component in the transfer passage and the removing structure is arranged to remove the foremost component in the transfer passage.

9. The apparatus of claim 6 wherein the arrangement is arranged to separate the component in the transfer passage that is next to and behind the foremost component in the transfer passage and the removing structure is arranged to remove the foremost component in the transfer passage.

10. The apparatus of claim 4 wherein the arrangement is arranged to apply a mechanical force to the moved component.

11. The apparatus of claim 10 wherein the arrangement includes a cylinder connected to the varying pressure source, a piston in the cylinder and a rod coupled with the piston so that the rod and piston move together in response to fluid force from the varying pressure source moving the piston in the cylinder, the rod extending into the transfer passage for engaging and moving the component so it is separated.

12. The apparatus of claim 11 wherein the arrangement is arranged to apply to the piston an inhaling force resulting from pressure variations of the varying pressure source.

13. The apparatus of claim 11 wherein the arrangement is arranged to apply to the piston a discharge force resulting from pressure variations of the varying pressure source to the piston.

14. The apparatus of 11 wherein the structure for removing includes a second cylinder connected to the varying pressure source, a second piston in the second cylinder and a second rod coupled with the second piston so that the second rod and second piston move together in response to fluid force from the varying pressure source moving the second piston in the cylinder the second rod extending in a direction at a right angle to the movement direction of the rod extending into the transfer passage for moving a gripper for the foremost component.

15. An electronic component feeding apparatus, comprising:
    a transfer passage for transferring electronic components;
    a stopper for stopping advancement of the electronic components in the transfer passage;
    a source of varying pressure;
    a structure for removing one component at a time from the transfer passage and wherein the removed component is at the stopper;
    the stopper being connected in fluid flow relation to the source of varying pressure and including an arrangement responsive to the varying pressure source for separating one of the components in the transfer passage from other components in the transfer passage and for facilitating removal by the removing structure of one component at a time from the transfer passage; and a fluid flow path between the source of varying pressure and the transfer passage for applying a force to the components in the transfer passage to move the components in the transfer passage toward the stopper.

16. The apparatus of claim 15 wherein the fluid flow path is arranged to be responsive to the source of varying pressure for applying a fluid discharge force to the components in the transfer passage to move the components in the transfer passage toward the stopper.

17. An electronic component feeding apparatus, comprising:

a transfer passage for tranferring electronic components;

a stopper for stopping advancement of the electronic components in the transfer passage;

a source of varying pressure;

a structure for removing one component at a time from the transfer passage and wherein the removed component is at the stopper;

the stopper being connected in fluid flow relation to the source of varying pressure and including an arrangement responsive to the varying pressure source for separating one of the components in the transfer passage from other components in the transfer passage and for facilitating removal by the removing structure of one component at a time from the transfer passage;

a chamber for storing the components in bulk form, the chamber having an outlet through which the components flow into the transfer passage; and a stirrer for the components in the chamber, the stirrer including a vent in the chamber connected in fluid flow relation with the source of varying pressure for applying a fluid force to components in the chamber to move components in the chamber away from the outlet.

18. The apparatus of claim 17 wherein the vent is positioned in the chamber and connected in fluid flow relation with the source of varying pressure to apply a discharge pressure to the components in the chamber to push the components in the chamber away from the outlet.

19. The apparatus of claim 17 wherein the vent is positioned in the chamber and connected in fluid flow relation with the source of varying pressure to apply an inhaling pressure to the components in the chamber to suck the components in the chamber away from the outlet.

20. An electronic component feeding apparatus, comprising:

a transfer passage for transferring electronic components;

a stopper for stopping advancement of the electronic components in the transfer passage;

a vent hole at the stopper communicating with the transfer passage;

an air cylinder for generating an inhaling force at an intake port thereof in response to a driving force being applied to said air cylinder;

a lever for applying the driving force to the air cylinder; and a transmitting path for communicating the inhaling force from the intake port to the vent hole;

wherein the electronic components in the transfer passage can be transferred by the inhaling force communicated to the vent hole at the stopper.

21. The electronic component feeding apparatus according to claim 20 wherein the transmitting path includes an air tube.

22. An electronic component feeding apparatus, comprising:

a transfer passage for transferring electronic components;

a stopper for stopping advancement of the electronic components in the transfer passage;

a first vent hole at the stopper communicating with the transfer passage;

a second vent hole at the transfer passage;

an air cylinder for generating an inhaling force at an intake port thereof in response to a driving force being applied to said air cylinder;

a lever for applying the driving force to the air cylinder; and a transmitting path for communicating the inhaling force from the intake port to the first and second vent holes;

wherein the electronic components in the transfer passage can be transferred by the inhaling force communicated to the first vent hole at the stopper and at least a second of the electronic components, while stationary in the transfer passage, can be held by the inhaling force communicating to the second vent hole of the transfer passage.

23. The electronic component feeding apparatus according to claim 22, wherein the transmitting path includes an air tube.

24. An electronic component feeding apparatus comprising:

a transfer passage for transferring electronic components;

a stopper for stopping advancement of the electronic components in the transfer passage;

a first vent hole at the stopper and communicating with the transfer passage;

a second vent hole at the transfer passage;

an air cylinder for generating an inhaling force at an intake port thereof and a discharging force at a discharge port thereof in response to a driving force being applied to said air cylinder;

a lever for applying the driving force to the air cylinder;

a first transmitting path for communicating the inhaling force from the intake port to the first vent hole; and a second transmitting path for communicating the discharging force from the discharge port to the second vent hole;

wherein the electronic components in the transfer passage can be transferred by the inhaling force communicating to the first vent hole of the stopper and at least a second of the electronic components while stationary in the transfer passage can be held by the discharging force communicated to the second vent hole of the transfer passage.

25. The electronic component feeding apparatus according to claim 24, wherein the first and second transmitting paths include an air tube.

26. An electronic component feeding apparatus, comprising:

a transfer passage for transferring electronic components;

a stopper for stopping advancement of the electronic components in the transfer passage;

a vent hole at the stopper communicating with the transfer passage;

an air cylinder for generating an inhaling force at an intake port thereof in response to a driving force being applied to said air cylinder; and a transmitting path for communicating the inhaling force from the intake port to the vent hole;

wherein the electronic components in the transfer passage can be transferred by the inhaling force communicated to the vent hole at the stopper.

27. The electronic component feeding apparatus according to claim 26, wherein the transmitting path includes an air tube.

28. An electronic component feeding apparatus, comprising:

a transfer passage for transferring electronic components;

a stopper for stopping advancement of the electronic components in the transfer passage;

a first vent hole at the stopper communicating with the transfer passage;

a second vent hole at the transfer passage;

an air cylinder for generating an inhaling force at an intake port thereof in response to a driving force being applied to said air cylinder; and a transmitting path for communicating the inhaling force from the intake port to the first and second vent holes;

wherein the electronic components in the transfer passage can be transferred by the inhaling force communicated to the first vent hole at the stopper and at least a second of the electronic components, while stationary in the transfer passage, can be held by the inhaling force communicating to the second vent hole of the transfer passage.

29. The electronic component feeding apparatus according to claim 28, wherein the transmitting path includes an air tube.

30. An electronic component feeding apparatus comprising:

a transfer passage for transferring electronic components;

a stopper for stopping advancement of the electronic components in the transfer passage;

a first vent hole at the stopper and communicating with the transfer passage;

a second vent hole at the transfer passage;

an air cylinder for generating an inhaling force at an intake port thereof and a discharging force at a discharge port thereof in response to a driving force being applied to said air cylinder;

a first transmitting path for communicating the inhaling force from the intake port to the first vent hole; and a second transmitting path for communicating the discharging force from the discharge port to the second vent hole;

wherein the electronic components in the transfer passage can be transferred by the inhaling force communicating to the first vent hole of the stopper and at least a second of the electronic components while stationary in the transfer passage can be held by the discharging force communicated to the second vent hole of the transfer passage.

31. The electronic component feeding apparatus according to claim 30, wherein the first and second transmitting paths include an air tube.

* * * * *